United States Patent [19]

Mennucci et al.

[11] Patent Number: 5,777,259

[45] Date of Patent: *Jul. 7, 1998

[54] HEAT EXCHANGER ASSEMBLY AND METHOD FOR MAKING THE SAME

[75] Inventors: Joseph P. Mennucci, Manville, R.I.; Charles R. Mead, Newbury, Mass.

[73] Assignee: Brush Wellman Inc., Cleveland, Ohio

[ * ] Notice: The term of this patent shall not extend beyond the expiration date of Pat. No. 5,525,753.

[21] Appl. No.: 599,614

[22] Filed: Feb. 9, 1996

Related U.S. Application Data

[63] Continuation-in-part of Ser. No. 470,987, Jun. 6, 1995, Pat. No. 5,525,753, which is a continuation of Ser. No. 182,288, Jan. 14, 1994, abandoned.

[51] Int. Cl.$^6$ .............................. H05K 7/20; H01L 23/26
[52] U.S. Cl. ..................... 174/16.3; 165/80.3; 165/165; 361/704; 361/707
[58] Field of Search .................................. 174/16.3, 252; 361/707, 704, 708, 712, 713; 165/80.3, 185

[56] References Cited

U.S. PATENT DOCUMENTS

| | | | |
|---|---|---|---|
| 2,269,523 | 1/1942 | Deutsch | 29/189 |
| 2,994,203 | 8/1961 | Lackey et al. | 62/3.2 |
| 3,091,028 | 5/1963 | Westbrook et al. | 29/473.1 |
| 3,110,571 | 11/1963 | Alexander | 29/195 |
| 3,226,822 | 1/1966 | Budde et al. | 29/473.1 |
| 3,668,755 | 6/1972 | Larsen | 29/199 |
| 3,668,758 | 6/1972 | Krock et al. | 29/199 |
| 3,736,649 | 6/1973 | Bristow | 29/473.1 |

(List continued on next page.)

FOREIGN PATENT DOCUMENTS

| | | |
|---|---|---|
| 0 097 944 A2 | 1/1984 | European Pat. Off. |
| 0 485 205 | 6/1991 | European Pat. Off. |
| 3633907 | 10/1986 | Germany |
| 3633907 | 6/1989 | Germany |
| 63-89477 | 4/1988 | Japan |

OTHER PUBLICATIONS

Markstein, Howard W., Sep., 1995, "Optimizing Heat Sink Performance".
Levine, Bernard, Electronic News, Jan. 1, 1996, "Alcoa Eyes Packaging Fate As Intel Embraces Plastic".
Kim, James, USA Today, Feb. 17, 1995, "Intel Unveils P6 Successor To Pentium".
Tummala, Rao R. and Rymaszewski, Eugene J., Van Nostrand, New York 1989, "Microelectronics Packaging Handbook", Sections 1.3.5. and 8.2.
Vemaline Brochure, copyright 1994, "Cool Your 486 or Pentinum™ Processor".
Karavolis, Michael, Dec. 1993, "Production of Precision Clad 'Self Brazing' Materials to Achieve High Yields and Strong Joints".
Mahney, H.V. and Vader, D.T., "Predicted and Measured Performance of an Advanced Laminated Heat Sink for Multi-Chip Modules", Nov. 28 -Dec. 3, 1993.

*Primary Examiner*—Kristine L. Kincaid
*Assistant Examiner*—Chau N. Nguyen
*Attorney, Agent, or Firm*—Hopgood, Calimafde

[57] ABSTRACT

A heat exchanger assembly, having a first oxygen-rich copper base layer joined to a first layer of beryllium oxide, a first oxygen-rich copper layer joined to the first beryllium oxide layer, a second beryllium oxide layer joined to the first oxygen-rich copper layer, a second base layer of oxygen-rich copper joined to the second oxygen-rich copper layer, a second oxygen-rich copper base layer joined to the second beryllium oxide layer, and a heat exchanger structure direct bonded to the second base layer. The structure has a plurality of oxygen-rich copper fins stacked upon one another, each fin having a channel at a selected location therein. The material to material interfaces between adjacent stacked fins are joined to one another by direct bonding so as to form a solidified block structure. Each of the channels form a cooling chamber for receiving a fluid flow.

33 Claims, 21 Drawing Sheets

U.S. PATENT DOCUMENTS

| | | | |
|---|---|---|---|
| 3,744,120 | 7/1973 | Burgess et al. | 29/494 |
| 3,766,634 | 10/1973 | Babcock et al. | 29/471.9 |
| 3,829,598 | 8/1974 | Darnell | 174/15.1 X |
| 3,854,892 | 12/1974 | Burgess et al. | 29/196.1 |
| 3,911,553 | 10/1975 | Burgess et al. | 228/173 |
| 3,993,411 | 11/1976 | Babock et al. | 403/271 |
| 3,994,430 | 11/1976 | Cusano et al. | 228/122 |
| 3,996,603 | 12/1976 | Smith | 357/80 |
| 4,129,243 | 12/1978 | Cusano et al. | 228/122 |
| 4,172,261 | 10/1979 | Tsuzuki et al. | 357/81 |
| 4,242,598 | 12/1980 | Johnson et al. | 307/310 |
| 4,408,218 | 10/1983 | Grabbe | 357/70 |
| 4,409,278 | 10/1983 | Jochym | 428/163 |
| 4,413,766 | 11/1983 | Webster | 228/123 |
| 4,420,509 | 12/1983 | Barrell et al. | 427/206 |
| 4,483,810 | 11/1984 | Bunk et al. | 264/60 |
| 4,500,029 | 2/1985 | Yerman | 228/123 |
| 4,505,418 | 3/1985 | Neidig et al. | 228/122 |
| 4,538,170 | 8/1985 | Yerman | 357/80 |
| 4,624,404 | 11/1986 | Ohmae et al. | 228/198 |
| 4,639,760 | 1/1987 | Granberg et al. | 357/75 |
| 4,640,723 | 2/1987 | Sugai et al. | 148/411 |
| 4,646,129 | 2/1987 | Yerman | 357/74 |
| 4,649,416 | 3/1987 | Borkowski | 357/74 |
| 4,788,627 | 11/1988 | Ehlert et al. | 361/386 X |
| 4,809,135 | 2/1989 | Yerman | 361/404 |
| 4,811,166 | 3/1989 | Alvarez et al. | 361/386 |
| 4,811,893 | 3/1989 | Kanahara et al. | 228/198 |
| 4,860,939 | 8/1989 | Guinet et al. | 228/122 |
| 4,869,758 | 9/1989 | Watanabe et al. | 148/326 |
| 4,987,677 | 1/1991 | Tanaka et al. | 29/846 |
| 4,990,720 | 2/1991 | Kaufman | 174/524 |
| 4,996,116 | 2/1991 | Webster | 428/627 |
| 5,014,113 | 5/1991 | Casto | 257/674 |
| 5,020,586 | 6/1991 | Mansingh | 165/80.3 |
| 5,036,584 | 8/1991 | Beauregard et al. | 29/884 |
| 5,040,292 | 8/1991 | Siuzdak | 29/840 |
| 5,075,759 | 12/1991 | Moline | 357/70 |
| 5,082,163 | 1/1992 | Kanahara et al. | 228/124 |
| 5,097,385 | 3/1992 | Chu et al. | 361/382 |
| 5,125,451 | 6/1992 | Matthews | 165/80.4 |
| 5,126,511 | 6/1992 | Beauregard et al. | 174/52.4 |
| 5,168,348 | 12/1992 | Chu et al. | 257/713 |
| 5,176,309 | 1/1993 | Horiguchi et al. | 228/122 |
| 5,269,372 | 12/1993 | Chu et al. | 165/80.4 |
| 5,303,555 | 4/1994 | Chrysler et al. | 62/6 |
| 5,304,846 | 4/1994 | Azar et al. | 257/722 |
| 5,313,099 | 5/1994 | Tata et al. | 257/717 |
| 5,329,159 | 7/1994 | Lin | 257/666 |
| 5,370,178 | 12/1994 | Agonafer et al. | 165/137 |
| 5,371,405 | 12/1994 | Kagawa | 257/664 |
| 5,394,299 | 2/1995 | Chu et al. | 361/705 |
| 5,525,753 | 6/1996 | Mennucci et al. | 174/16.3 |
| 5,583,317 | 12/1996 | Mennucci et al. | 174/16.3 |
| 5,602,720 | 2/1997 | Natsuhara et al. | 361/708 |

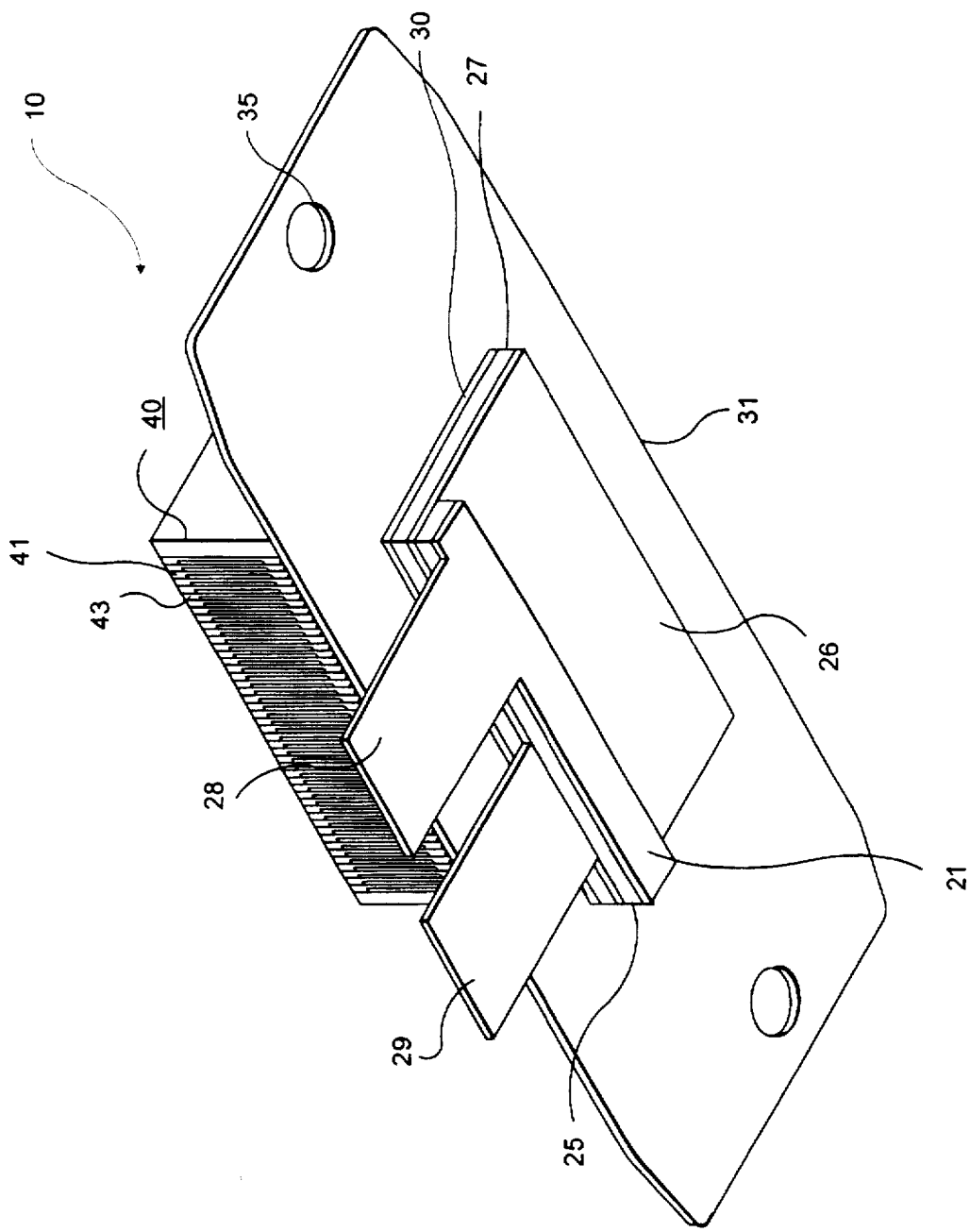
FIG. IA

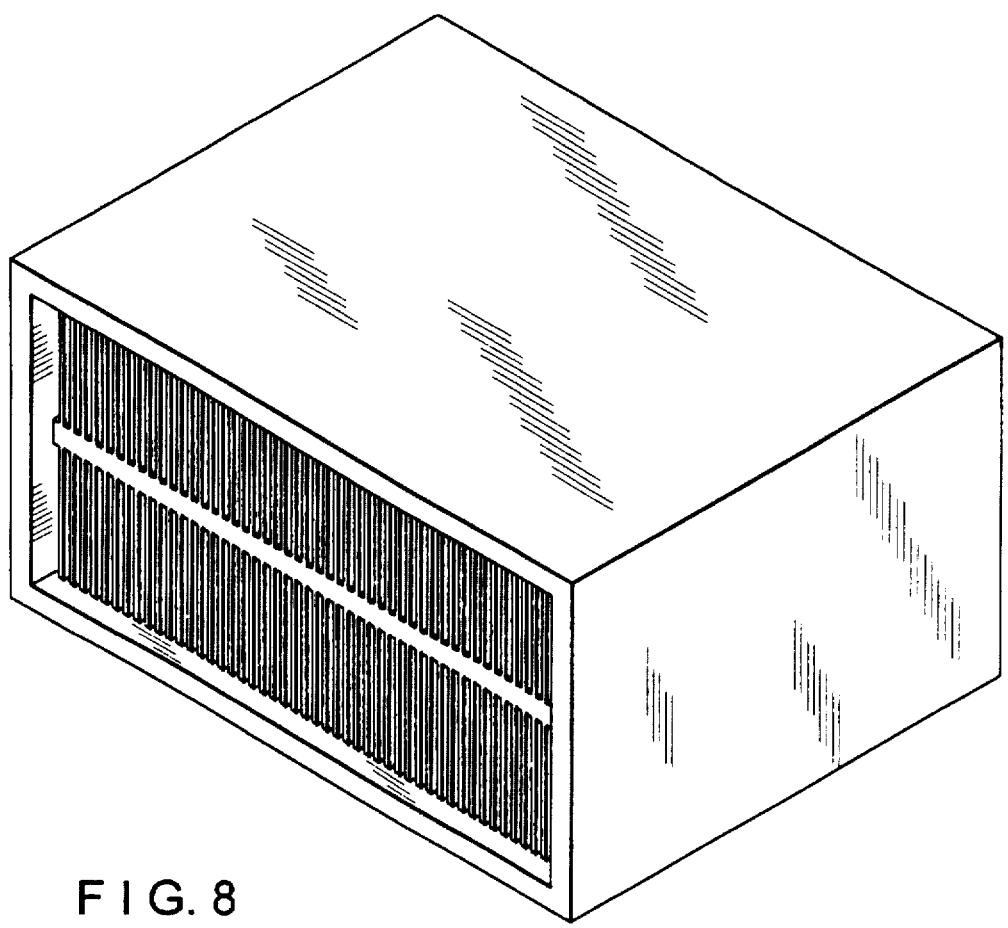
F I G. 8
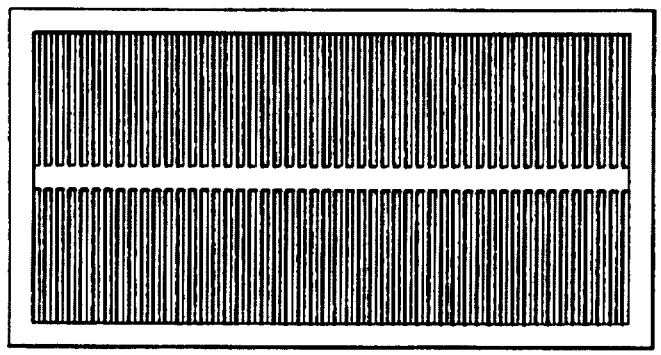
F I G. 9

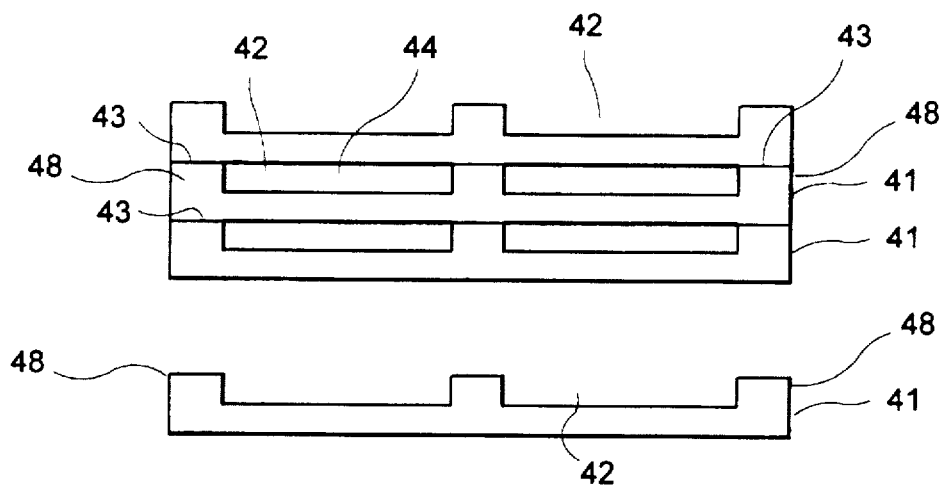
F I G. 10
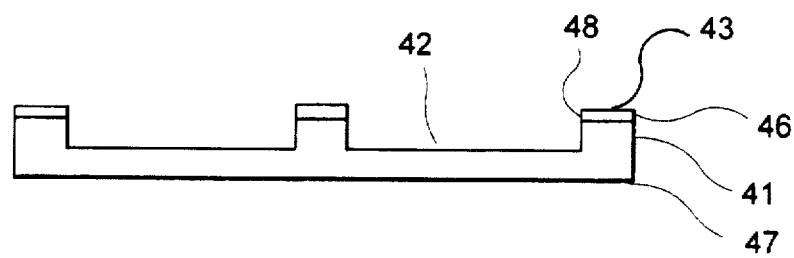
F I G. 11
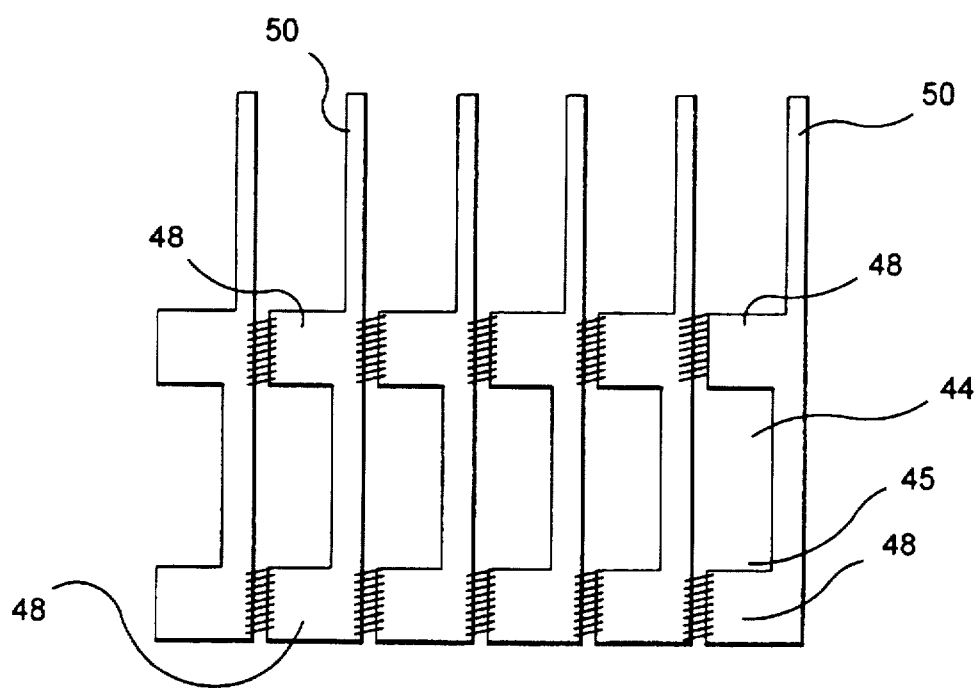
F I G. 12

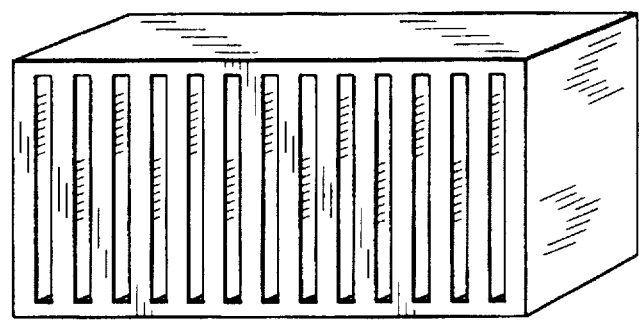
F I G. 13A
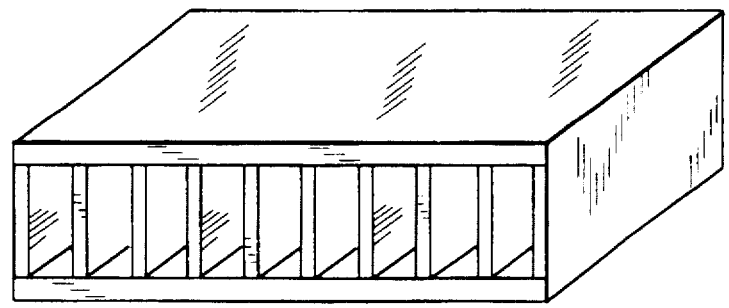
F I G. 13B

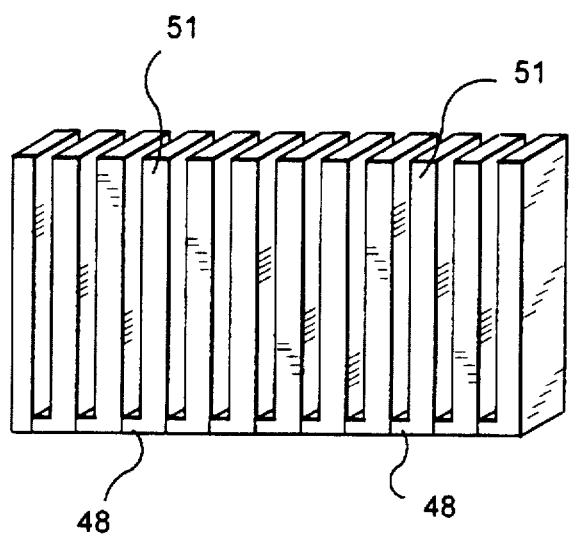
F I G. 14
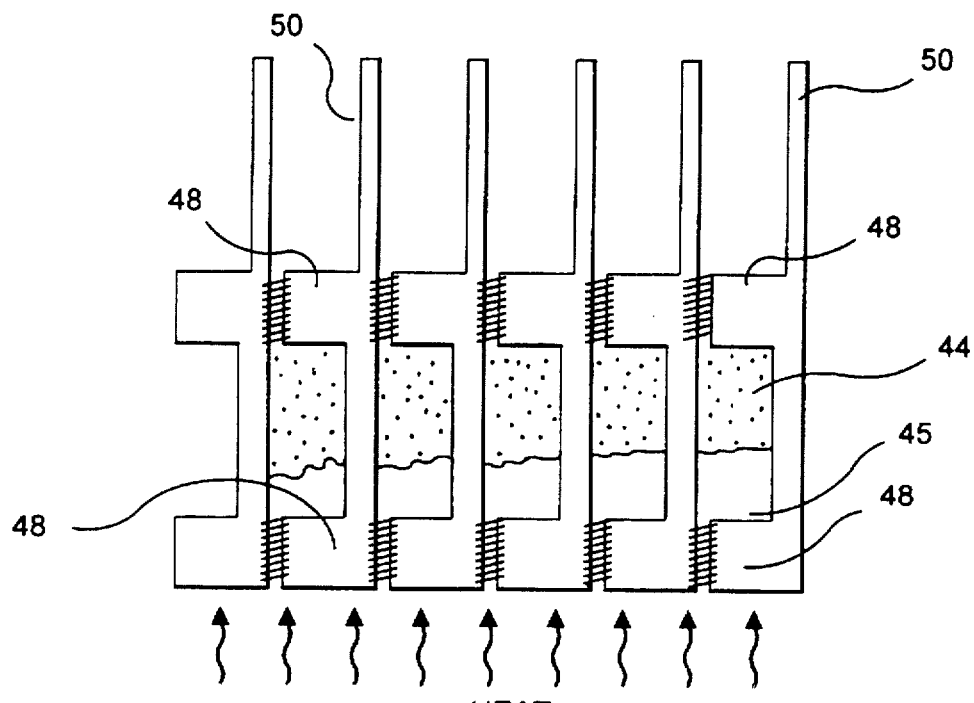
F I G. 15
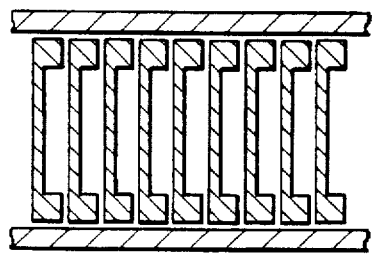
F I G. 16A
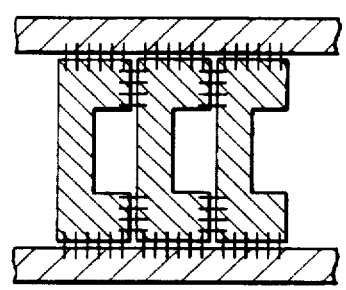
F I G. 16B

 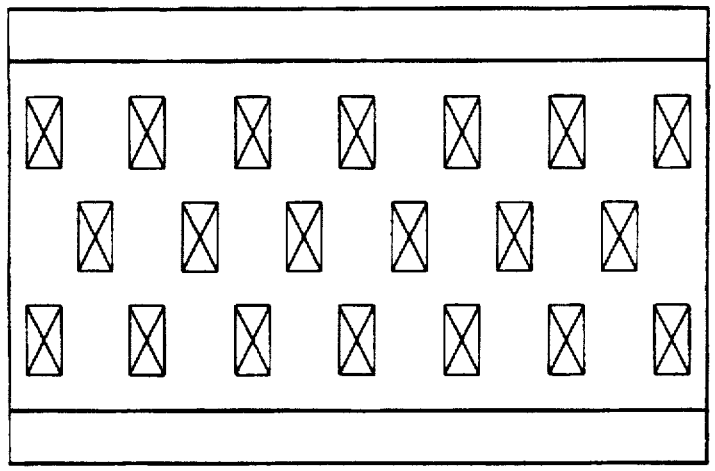
F I G. 20B     F I G. 20A
 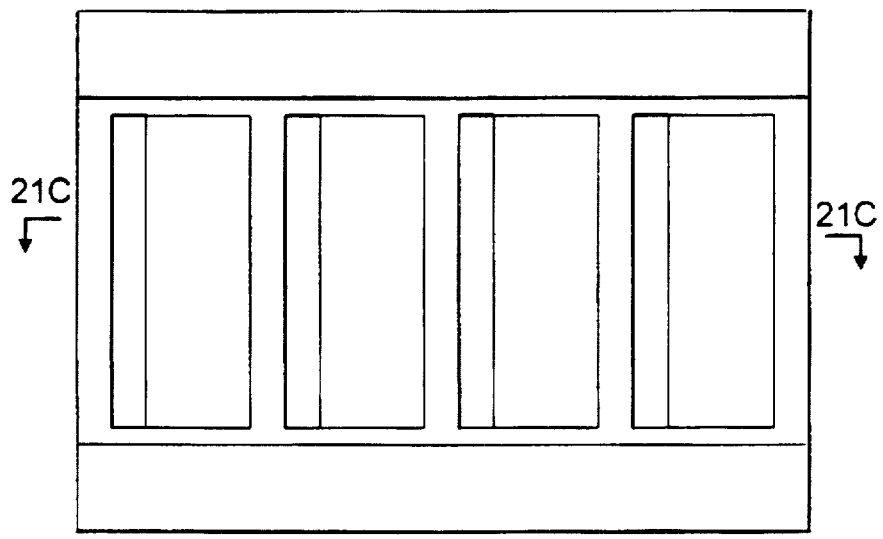
F I G. 21B     F I G. 21A
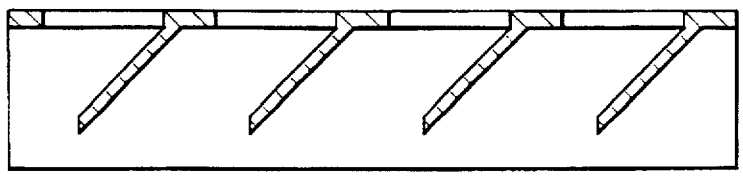
F I G. 21C

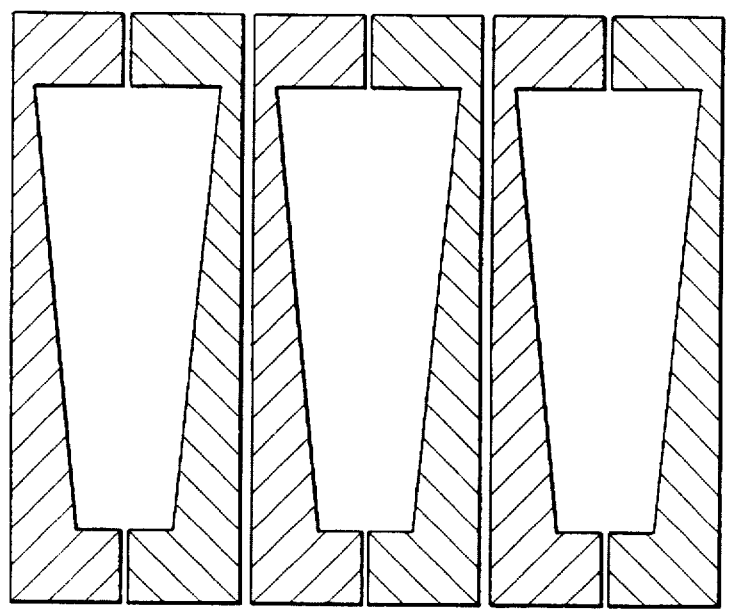
F I G. 21D
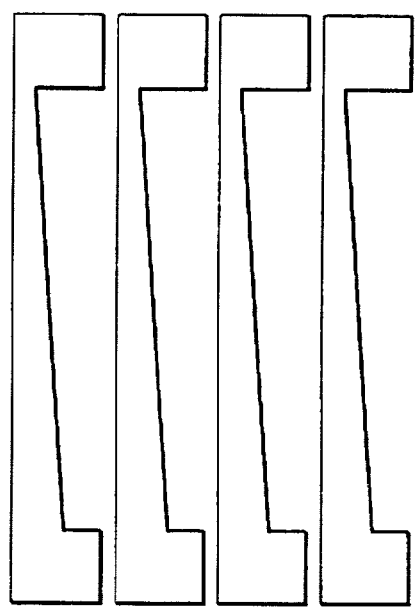
F I G. 21E

1

HEAT EXCHANGER ASSEMBLY AND METHOD FOR MAKING THE SAME

This application is a continuation-in-part of application Ser. No. 08/470,987 filed Jun. 6, 1995 now U.S. Pat. No. 5,525,753, which is a continuation of application Ser. No. 08/182,288 filed Jan. 14, 1994, now abandoned.

FIELD OF INVENTION

The present invention relates to multilayer laminates used in heat transfer applications and more particularly to a new high efficiency heat exchanger for microelectronic packaging and the like.

BACKGROUND OF THE INVENTION

Materials having relatively high thermal conductivities have been found desirable for use in heat dissipation devices, particularly those for microelectronic packaging. Both aluminum and commercially pure copper, for example, are noted for their ability to rapidly conduct and dissipate heat, and hence are often materials of choice for use in heat exchanger blocks.

Conventional aluminum heat exchanger blocks include passive air systems which rely upon open air geometry and the rapid heat dissipation characteristics of aluminum for heat transfer. Their inherent limitations for high performance applications, however, have lead to the use of forced air systems, e.g., electric fans, to enhance the transfer of heat away from a point source. While relatively effective for some applications, additional space is required adding substantially to unit cost. Difficulties with the long-term reliability of electric fans and insufficient battery life have also been experienced.

In contrast, other heat exchanger blocks, passive in nature, are constructed substantially of copper, and rely upon the superior heat dissipation characteristics of copper and optimized block geometry to effect heat transfer. These heat exchanger blocks (known as chill blocks) typically comprise multiple stacked fins of commercially pure copper sheeting. A heat sink of this general configuration is shown, for example, in U.S. Pat. No. 5,304,846 by Kaveh Azar and Richard E. Caron, issued Apr. 19, 1994, and entitled "NARROW CHANNEL FINNED HEAT SINKING FOR COOLING HIGH POWER ELECTRONIC COMPONENTS", the disclosure of which is hereby incorporated by reference in its entirety.

To enhance heat transfer, layers of a controlled oxygen content copper clad laminate have been substituted for the pure copper layers, expanding the use of chill blocks to high performance environments. Such a laminate and a process for making the same is found, for example, in a copending U.S. patent application, Ser. No. 08/470,987 filed Jun. 6, 1995 by Joseph P. Mennucci and Charles R. Mead, and entitled "MULTILAYER LAMINATE PRODUCT AND PROCESS", the disclosure of which is hereby incorporated by reference in its entirety.

In environments where heat transfer demands are extraordinary, such as microelectronic packaging for electric vehicle motors and state-of-the-art microchips, the foregoing constructions have not only been costly, but also ineffective.

SUMMARY OF THE INVENTION

It is therefore an object of the present invention to provide a heat exchanger structure having superior heat transfer characteristics for high performance applications.

Another object of the present invention is to provide a heat exchanger structure having both increased surface area for thermal transfer and decreased size for more effective utilization of space.

A further object of the present invention is to optimize energy transfer characteristics of heat exchanger blocks.

Still another object of the present invention is to provide an economical, reliable, high performance heat exchanger structure for use in microelectronic packaging or the like.

Yet a further object of the present invention is to meet the rapid heat dissipation needs of microelectronic packaging used with electric vehicle motors and state-of-the-art microprocessors.

Still another object of the present invention is to thermally isolate microelectronic modules from one another.

In accordance with one aspect of the present invention there is provided a heat exchanger assembly, which comprises:

a first base layer of oxygen-rich copper joined to a first layer of beryllium oxide;

an intermediate oxygen-rich copper layer joined to the first beryllium oxide layer;

a second beryllium oxide layer joined to the intermediate oxygen-rich copper layer;

a second oxygen-rich copper layer joined to the second beryllium oxide layer;

a second base layer of oxygen-rich copper joined to the second oxygen-rich copper layer; and a heat exchanger structure joined to the second base layer, the structure comprising a plurality of oxygen-rich copper fins stacked upon one another, each fin having a channel at a selected location therein, and the material to material interfaces between adjacent stacked fins being joined to one another so as to form a solidified block structure, each channel forming a cooling chamber.

In accordance with another aspect of the present invention, there is provided a method for making a heat exchanger assembly, which comprises the steps of:

joining a first base layer of oxygen-rich copper to a first layer of beryllium oxide;

joining an intermediate oxygen-rich copper layer to the first beryllium oxide layer;

joining a second beryllium oxide layer to the intermediate oxygen-rich copper layer;

joining a second oxygen-rich copper layer to the second beryllium oxide layer;

joining a second base layer of oxygen-rich copper to the second oxygen-rich copper layer; and joining a heat exchanger structure to the second base layer, the structure comprising a plurality of oxygen-rich copper fins stacked upon one another, each fin having a channel at a selected location therein, and the material to material interfaces between adjacent stacked fins being joined to one another so as to form a solidified block structure, each channel forming a cooling chamber.

In accordance with yet another aspect of the invention is a heat exchanger structure joined to an oxygen-rich copper first layer, the structure comprising a plurality of oxygen-rich copper fins stacked upon one another, each fin having a channel at a selected location therein, and the material to material interfaces between adjacent stacked fins being joined to one another so as to form a solidified block structure, each channel forming a cooling chamber.

According to a further aspect of the present invention is a heat exchanger base having:

- a first base layer of oxygen-rich copper joined to a first layer of beryllium oxide;
- an intermediate oxygen-rich copper layer joined to the first beryllium oxide layer;
- a second beryllium oxide layer joined to the intermediate oxygen-rich copper layer;
- a second base layer of oxygen-rich copper joined to the second oxygen-rich copper layer; and
- a second oxygen-rich copper base layer joined to the second beryllium oxide layer.

In accordance with still another aspect of the invention is a vehicle propelled by an electric motor, the motor comprising a motor control module having a series of power transistor switches, each effecting an increment of vehicle acceleration upon activation, and corresponding heat exchanger assemblies for dissipating heat energy generated upon activation of the switches, each assembly comprising:

- a first base layer of oxygen-rich copper joined to a first layer of beryllium oxide;
- an intermediate oxygen-rich copper layer joined to the first beryllium oxide layer;
- a second beryllium oxide layer joined to the intermediate oxygen-rich copper layer;
- a second oxygen-rich copper layer joined to the second beryllium oxide layer;
- a second base layer of oxygen-rich copper joined to the second oxygen-rich copper layer; and
- a heat exchanger structure joined to the second base layer, the structure comprising a plurality of oxygen-rich copper fins stacked upon one another, each fin having a channel at a selected location therein, and the material to material interfaces between adjacent stacked fins being joined to one another so as to form a solidified block structure, each channel forming a cooling chamber.

In accordance with yet a further aspect of the invention is an ultra high performance microprocessor in combination with a heat exchanger assembly adapted for dissipating heat energy generated by the microprocessor, the assembly comprising:

- a first base layer of oxygen-rich copper joined to a first layer of beryllium oxide;
- an intermediate oxygen-rich copper layer joined to the first beryllium oxide layer;
- a second beryllium oxide layer joined to the intermediate oxygen-rich copper layer;
- a second layer of oxygen-rich copper joined to the second beryllium oxide layer;
- a second base layer of oxygen-rich copper joined to the second oxygen-rich copper layer; and
- a heat exchanger structure joined to the second base layer, the structure comprising a plurality of oxygen-rich copper fins stacked upon one another, each fin having a channel at a selected location therein, and the material to material interfaces between adjacent stacked fins being joined to one another so as to form a solidified block structure, each channel forming a cooling chamber and being at least partially filled with a selected coolant fluid.

Although the present invention is shown and described in connection with oxygen-rich copper, other materials may be used, alternatively or concurrently therewith, such as those containing precious metals, aluminum, titanium, nickel, steel, and their alloys as well as carbon and ceramics.

The present invention will now be further described by reference to the following drawings which are not intended to limit the accompanying claims.

BRIEF DESCRIPTION OF THE DRAWINGS

FIG. 1A is a bottom perspective view of the assembly of FIG. 1;

FIG. 8 is a perspective view of the heat exchanger assembly according to a further aspect of the present invention.

FIG. 9 is a side view of the assembly of FIG. 8;

FIG. 10 is a side view of oxygen-rich copper fins in accordance with one aspect of the present invention, channeled and stacked, before and after direct bonding;

FIG. 11 is a side view of a fin of FIG. 10 accentuating the layers of oxygen-free and oxygen-rich layers;

FIG. 12 is a side sectional view of a heat exchanger assembly in accordance with another aspect of the present invention;

FIG. 13A is a perspective view of a heat exchanger assembly in accordance with yet another aspect of the present invention;

FIG. 13B is a perspective view of a heat exchanger assembly in accordance with a further aspect of the present invention;

FIG. 14 is a perspective view of a heat exchanger assembly in accordance with still another aspect of the present invention;

FIG. 15 is a side view of a heat exchanger assembly in accordance with still a further aspect of the present invention;

FIGS. 16A and 16B are side views of heat exchanger assemblies with formed fins in accordance with another aspect of the present invention;

FIG. 20A is a plan view of strip with embossed surfaces in accordance with a further aspect of the present invention;

FIG. 20B is a side view of the strip in FIG. 20A;

FIG. 21A is a plan view of strip with louvers in accordance with yet a further aspect of the present invention;

FIG. 21B a side view of the strip in FIG. 21A;

FIG. 21C is a sectional view taken along line C-C of FIG. 21A;

FIG. 21D is a plan view of strip with tapered fins in accordance with another aspect of the present invention;

FIG. 21E is a side view of the strip of FIG. 21D;

The same numerals are used throughout the drawing figures to designate similar elements. Still other objects and advantages of the present invention will become apparent from the following description of the preferred embodiments.

DETAILED DESCRIPTION OF THE PREFERRED EMBODIMENTS

Figure 1:
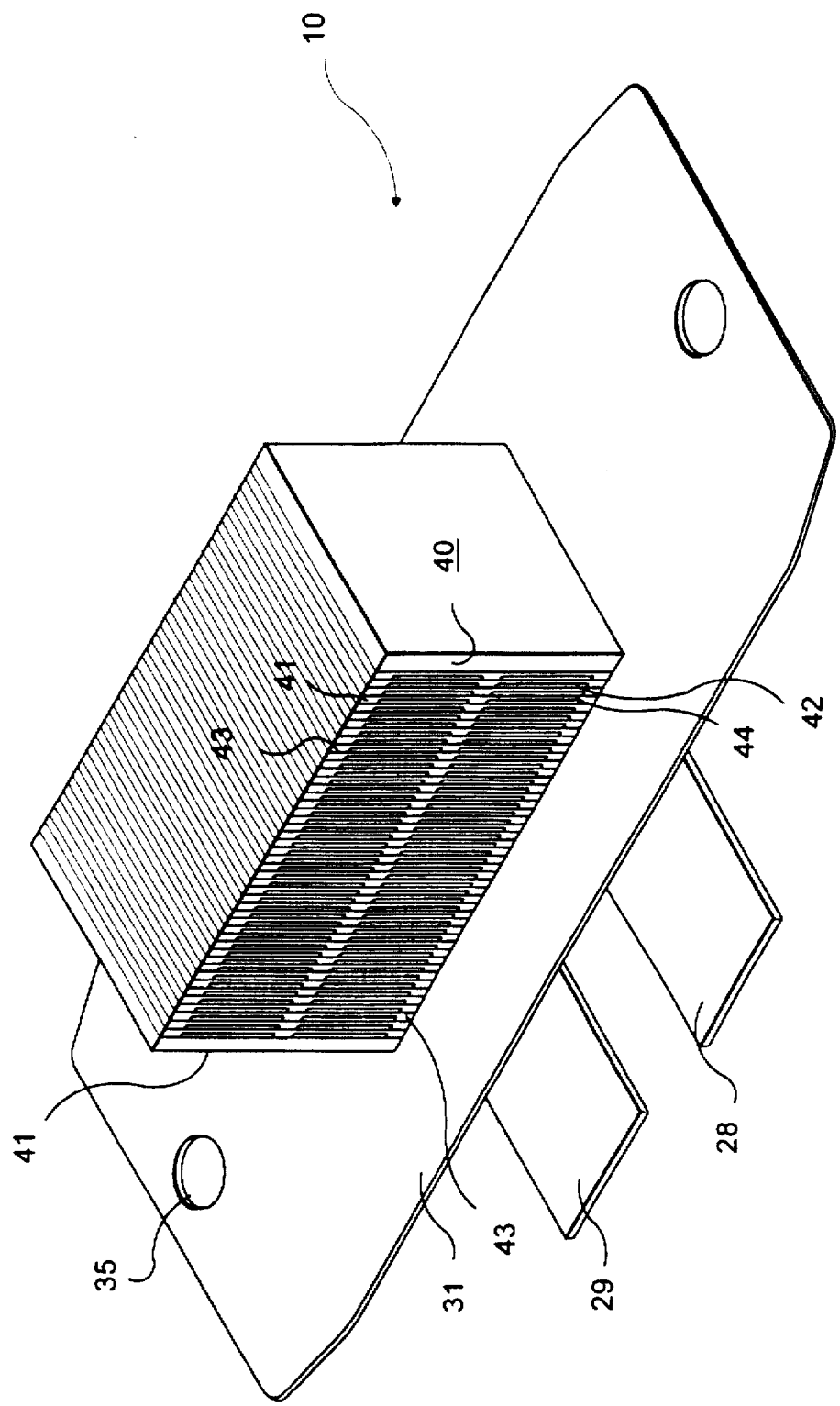
FIG. 1 is a perspective view of a heat exchanger assembly in accordance with one aspect of the present invention.
Figure 2:
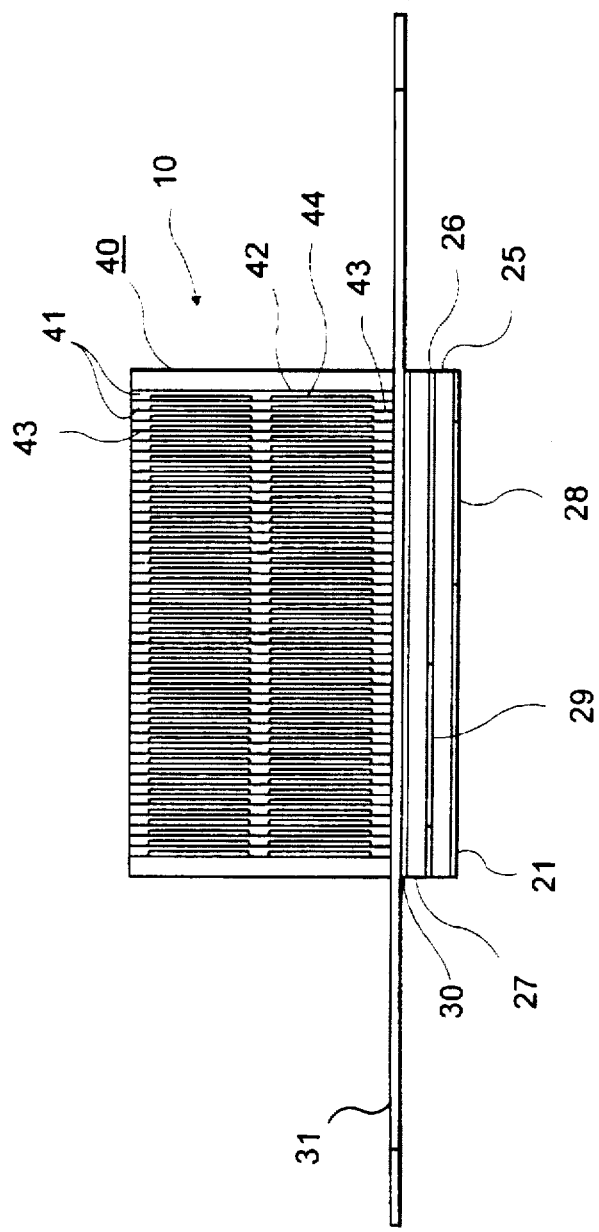
FIG. 2 is a side view of the assembly of FIG. 1.
Figure 3:
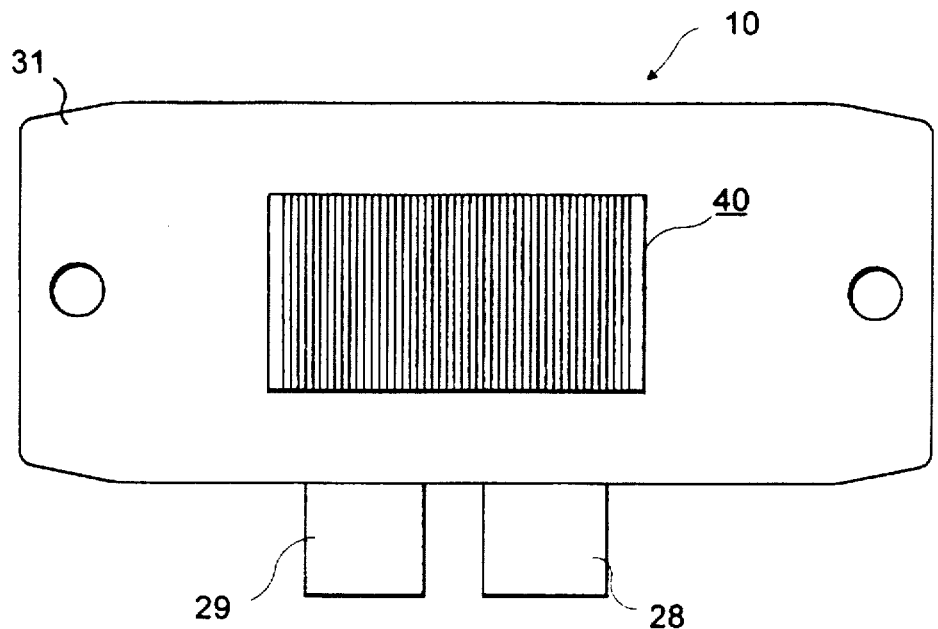
FIG. 3 is a plan view of the assembly of FIG. 1.

Electric vehicle acceleration is accomplished, for example, by pulling a series of switches in a motor control module, rather than by shifting gears. Each switch corresponds to an increment of speed. The greater the speed desired, the more switches that must be pulled. To accelerate the vehicle to a selected maximum speed, e.g., 75 mph, up to 36 switches may be pulled.

Each switch comprises a power transistor or silicon control rectifier (SCR). Although each SCR generally requires the same amount of power for operation, in providing the requisite horsepower to propel and accelerate an automobile, it must generate substantial heat energy. In order to insure effective, reliable motor operation, this energy must be dissipated quickly and efficiently.

Similarly, state-of-the-art ultra high performance microchips such as the PENTIUM™ 486, P60™, P70™, P80™ or the POWERPC™, generate considerable heat energy during operation. Both rapid dissipation of heat and thermal isolation have been found relatively important to effective chip operation and product longevity.

The foregoing discussion is provided to illustrate possible applications of the present invention, but not to limit its intended environment.

It has been found that the use of a heat exchanger assembly, in accordance with the present invention, with each SCR of a motor control module or with a state-of-the-art microchip achieves a cooling efficiency which is both extraordinary and unprecedented. Highly efficient cooling is achieved through a structure which is both reliable and inexpensive to produce.

A high performance heat exchanger assembly 10, in accordance with various aspects of the present invention, is illustrated generally in FIGS. 1–29. The assembly comprises a base having a first base layer 21 of oxygen-rich copper joined to a first layer of beryllium oxide 25. An intermediate oxygen-rich copper layer 26 is joined to the first beryllium oxide layer and a second beryllium oxide layer 27 is joined to the intermediate oxygen-rich copper layer. A second oxygen-rich copper layer 30 is then joined to the second beryllium oxide layer, and a second base layer 31 of oxygen-rich copper to the second oxygen-rich copper layer. Second base layer 31 is preferably shaped and dimensioned so as to extend outwardly from second layer 30, and has perforations 35 for receiving suitable fasteners. This enables the heat exchanger assembly to be mounted to a motor control module 60, shown, for example, in FIG. 26.

Another facet of the invention is the geometry and composition of a heat exchanger structure 40 which is joined to the second base layer, as shown in FIGS. 1–4A. This structure comprises a plurality of oxygen-rich copper fins 41 stacked upon one another, each fin having a channel 42 at a selected location therein. Material-to-material interfaces 43 between adjacent stacked fins are joined to one another such that a solidified block structure is formed. The channels each form a fluid receiving chamber 44. Alternatively or concurrently therewith, the channels are at least partially filled with a selected coolant fluid 45, e.g., a dielectric fluid such as a fluorocarbon or FLOURNERT™ type fluid, as shown in FIG. 15.

Figure 5:
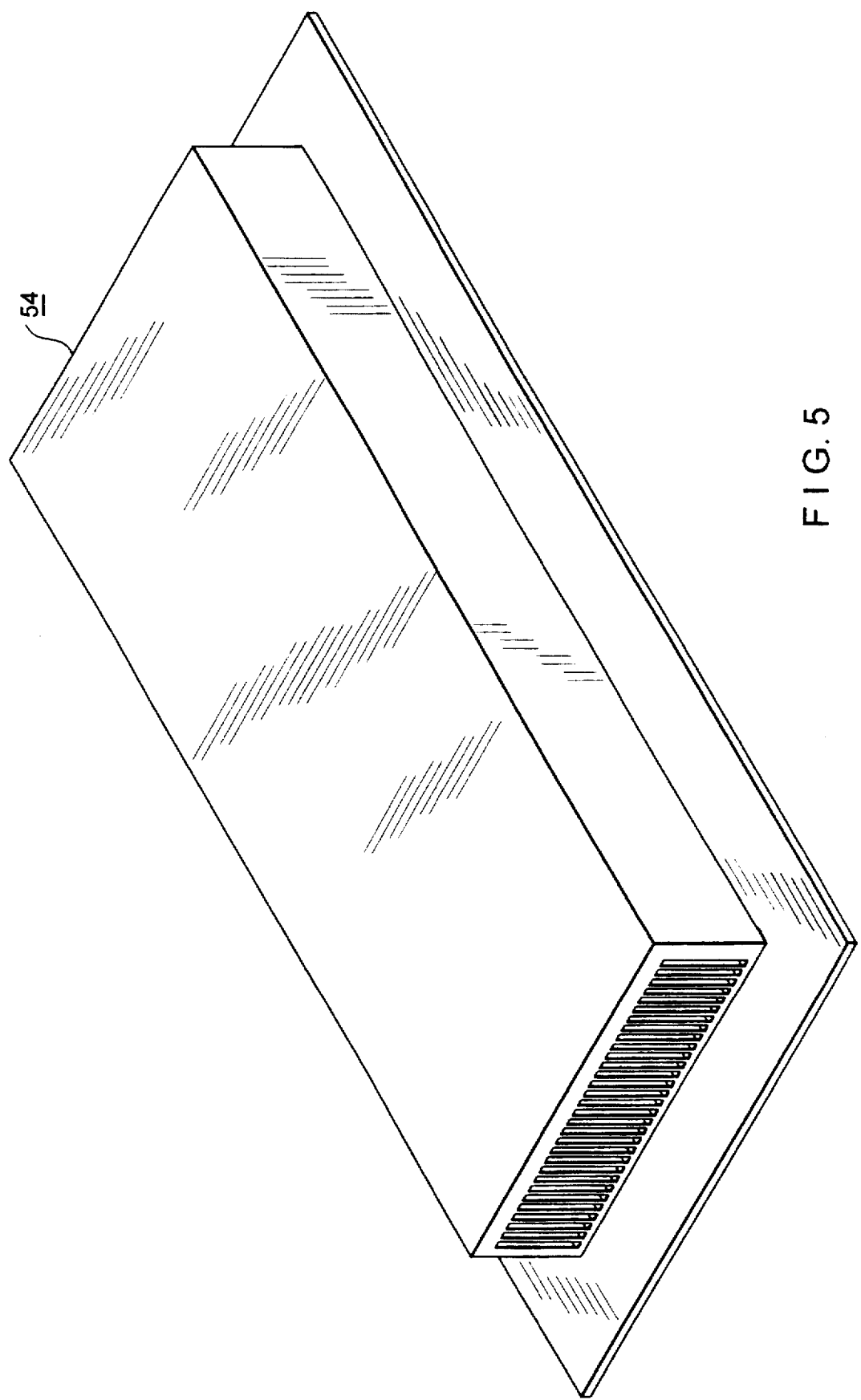
FIG. 5 is a perspective view of a heat exchanger assembly according to another aspect of the present invention.
Figure 7:
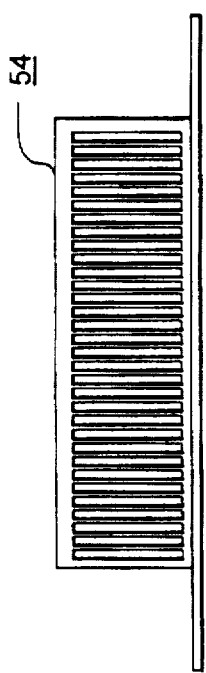
FIG. 7 is a side view of the assembly of FIG. 5.
Figure 6:
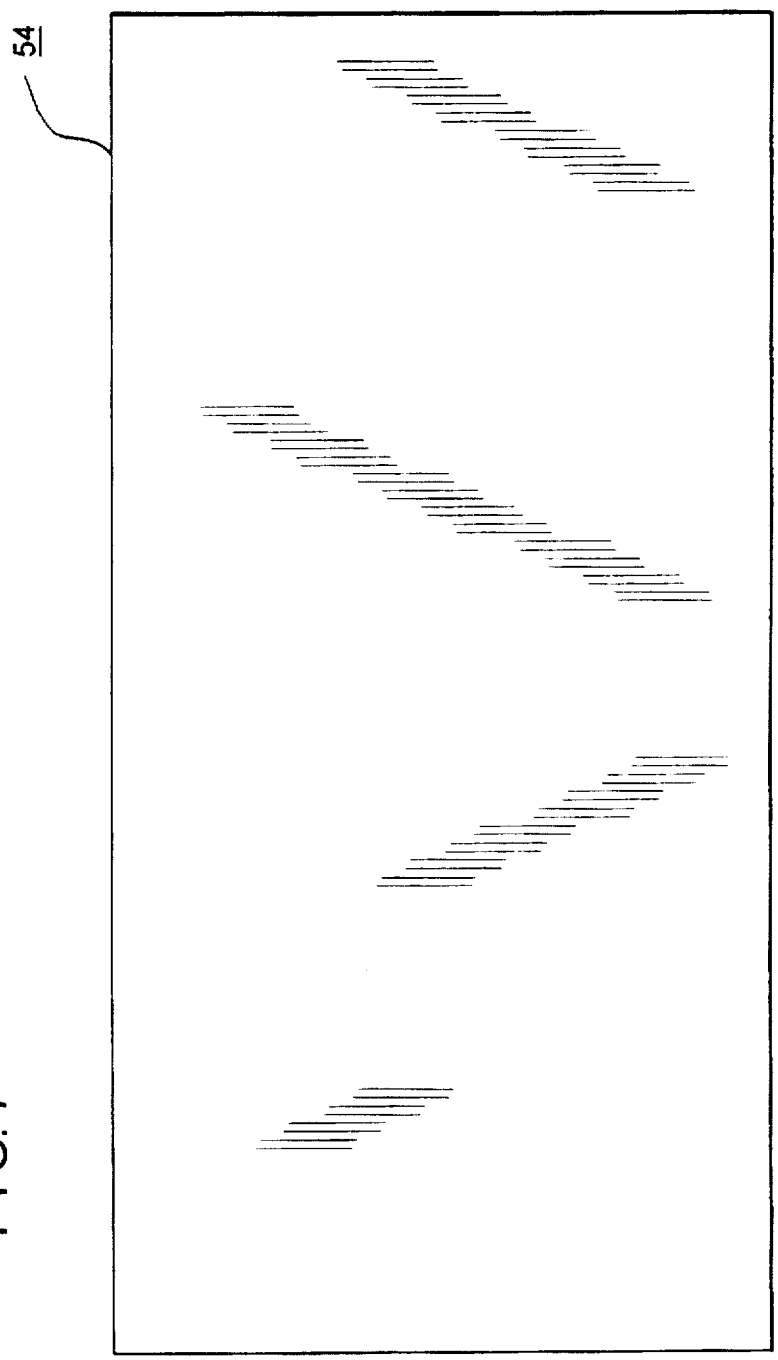
FIG. 6 a bottom view of the assembly of FIG. 5.

According to another aspect of the present invention, as shown in FIGS. 5–7, is a heat exchanger assembly 54, e.g., for a motor control module, which utilizes a single, relatively large oxygen-rich copper heat exchanger and base assembly with integral manifold. An advantage is the incorporation of the manifold as part of the assembly. Other embodiments of the present invention are provided in FIGS. 8, 9, 13A and 13B.

It is preferred that one or more of the oxygen-rich copper layers (or other portions of the heat exchanger assembly) comprise a new alloy of copper which is about 99.95% Cu and contains a controlled balance of $O_2$ and various impurities (hereinafter referred to as "Alloy C11004"). This represents a discovery of the extraordinary bonding characteristics of Alloy C11000 at relatively high oxygen contents and minimal impurity levels.

One example is a higher order copper alloy containing a controlled balance of oxygen and various impurities, the alloy being represented generally by the formula (350–709 ppm $O_2$)+(0–30 ppm Ni)+(0–19 ppm Fe)+(0–30 ppm Si)+ (0–30 ppm Al)+(0–23 ppm Zn)+(0–9 ppm Co)+(0–9 ppm Sn) +(0–9 ppm Pb)+(0–9 ppm Mg)+(0–9 ppm Mn)+(0–9 ppm Ca), the balance copper.

Another example is a higher order copper alloy containing a controlled balance of oxygen and various impurities, the alloy being represented by the formula (350–709 ppm $O_2$)+(0–30 ppm Ni)+(0–19 ppm Fe)+(0–30 ppm Si) +(0–30 ppm Al)+(0–23 ppm Zn)+(0–9 ppm Co) +(0–9 ppm Sn)+ (0–9 ppm Pb)+(0–9 ppm Mg)+(0–9 ppm Mn)+(0–9 ppm Ca)+(0–9 ppm Be)+(0–9 ppm Cr)+(0–9 ppm P), the balance copper.

The foregoing formulas indicate the ranges of oxygen and impurities which have consistently yielded acceptable direct bonding of Alloy C11000 to a ceramic substrate, e.g., beryllium oxide, for relatively high performance heat transfer applications. An exemplary definition of a successful bond, according to one aspect of the present invention, is one which gives a minimum of 15 lbs./in. peel strength for a 0.015 in. thick copper sheet direct bonded to a 0.025 in. thick ceramic, e.g., beryllium oxide, using a 90 degree peel strength test.

It has been found that outside the stated oxygen and impurity ranges, the suitability of high oxygen content C11000 to bonding for the high energy transfer demands of state-of-the-art electronics is unpredictable. Copper alloys with constituents falling within these parameters are hereinafter referred to as Alloy C11004.

Alloys of this type are described, for example, in a co-pending continuation-in-part of application Ser. No. 08/470,987 filed on the same date herewith by Joseph P. Mennucci, Charles R. Mead, Kiran Dalal, Shelly J. Wolf and David Ross, and entitled "ALLOY C11004", the disclosure of which is hereby incorporated by reference in its entirety. The oxygen content of C11004 is generally within a range of 350 ppm to 709 ppm. This range, it has been found, yields consistent results in bond uniformity and strength.

According to the present invention, the various layers of beryllium oxide are preferably joined to adjacent oxygen-rich copper layers by direct bonding. During direct bonding, temperature and other conditions not only cause metal-to-nonmetal bonding, but simultaneously anneal adjacent oxygen-rich copper laminates. This also metallurgically bonds their constituent layers. Methods of joining metals to ceramics by direct bonding technology are described, for example, in U.S. Pat. No. 3,944,430, which issued on Nov. 30, 1976, and in U.S. Pat. No. 4,129,243, which issued on Dec. 12, 1978; the disclosures of both patents are hereby incorporated by reference in their entireties.

The first base layer is preferably sized and proportioned so that at least a portion extends from the lateral boundary of the first beryllium oxide layer, and outwardly from the heat exchanger assembly. For example, a relatively flat rectangular prong 28 protrudes laterally from the layer. This provides an electrical connector, e.g., for plugging heat exchanger assembly 10 into microelectronic packaging such as a motor control module.

The intermediate oxygen-rich copper layer, like the first base layer, is also desirably configured such that at least a portion extends beyond the lateral boundary of the second beryllium oxide layer, and outwardly from the heat exchanger assembly. A prong 29, for example, is similarly formed in the intermediate layer for electrical connection, such as to plug into a motor control module.

The heat exchanger assembly is formed by joining the heat exchanger structure to the second base layer, preferably direct bonding, in accordance with the present invention. In one embodiment, the structure comprises a plurality of oxygen-rich copper fins 41, best seen in FIG. 10.

Figure 4:
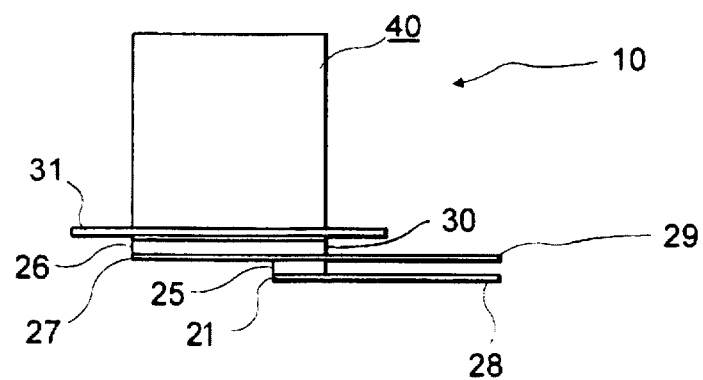
FIG. 4 is a rotated side view of the assembly of FIG. 2.
Figure 4A:
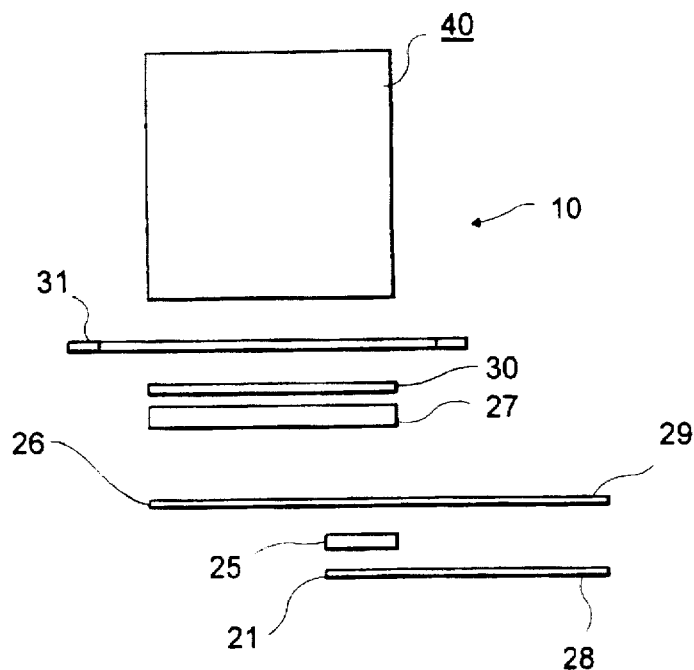
FIG. 4A is an exploded view of the assembly of FIG. 4.
Figure 4B:
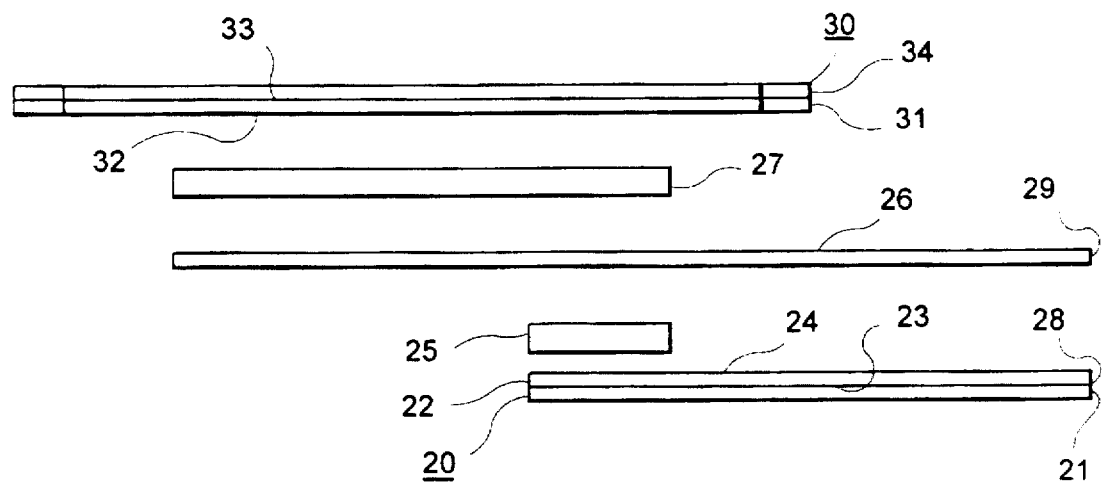
FIG. 4B is an enlarged view of the base assembly shown in FIG. 4A.

Alternatively, as shown in FIG. 11, each fin 41 includes a layer 46 of oxygen-free copper (C10100) clad to a layer 47 of oxygen-rich copper (C11000 or C11004), and has a channel, e.g., skived or profiled, at a selected location therein. More particularly, the first and second base layers may each be replaced with a controlled oxygen content copper clad laminate. The laminates are preferably constructed as set forth in co-pending patent application Ser. No. 08/470,987 filed Jun. 6, 1995, the disclosure of which has been incorporated by reference in its entirety. As shown in FIG. 4B, each laminate, for instance, comprises a base layer 21 of oxygen-free copper and a first layer 22 of oxygen-rich copper having first and second portions 23, 24. The first portion is joined to the base layer, preferably by cladding, and the second portion is joined to the first layer 25 of beryllium oxide, preferably by direct bonding. First laminate 20 serves as a base for the heat exchanger assembly.

Second laminate 30 has a base layer 31 of oxygen-rich copper and a first layer 34 of oxygen-free copper. The base layer has first and second portions 32, 33, respectively, the first portion being joined to the first layer, preferably by cladding, and the second portion being joined to second layer 27 of beryllium oxide, preferably by direct bonding. The second laminate forms a base for mounting the heat exchanger structure of the present invention.

The various oxygen-rich copper layers comprise copper sheeting having an oxygen content generally within a range of 95 ppm and 2000 ppm. Generally speaking, as the oxygen content decreases, bond strength increases. A maximum strength is typically found at about 95 ppm. When using Alloy C11004, the preferred range of $O_2$ content is generally between 350 ppm and 709 ppm with a maximum strength at about 350 ppm.

In operation, heat energy generated from a source beneath the assembly, e.g., by an SCR or advanced microprocessor, is conducted via connectors (or prongs 28) from the first base layer, to the first beryllium oxide layer, onto the intermediate oxygen-rich copper layer (and via associated connectors or prongs 29), to the second beryllium oxide layer, onto the second base layer, and into the various fins of the heat exchanger structure for rapid dissipation.

In accordance with one aspect of the present invention, each fin is a strip about 0.008 in. thick and about 2.000 in. wide. As shown in FIGS. 10 and 11, a channel is profiled in the strip about 0.040 in. deep ±0.0005 in. and about 2.000 in. wide and runs generally along the center of the strip, from one strip side to the other.

Alternatively or concurrently therewith, direct bond copper (DBCu) laminates are used as fins of the heat exchanger structure. Each fin is stamped from multi-gauge DBCu strip having a channel generally along its center such that spacers 48 are left on opposing sides of the fin. Each fin has dimensions selected giving consideration to the purpose for which the present invention is intended.

The fins are stacked upon one another and joined (or fixtured) together by direct bonding to form a solidified block structure. During direct bonding, diffusion bonding (or interdiffusion) occurs at metal-to-metal interfaces between the fins. Simultaneously, there is diffusion bonding at the metal-to-metal interfaces between adjacent sides of the stacked fins, substantially eliminating voids between the interfaces. The result is a void-free, multiple-layer, solidified copper block with fluid receiving channels dimensioned for maximum heat transfer capability.

Exemplary chill block geometries and specifications, according to various applications of the present invention, are provided in TABLE I below. This illustrates the mating of optimum block geometry with the heat transfer characteristics of a selected material, here Alloy C11004, in order to meet various fluid flow rates, pressure conditions, and power demands.

TABLE I

EXAMPLE CHILL BLOCK CONSTRUCTIONS

| Item No. | Base Thickness (in.) | Fin Thickness (in.) | Fin Space (in.) | Fin Height (in.) | Fin Length (in.) | Block Width (in.) | Block Height (in.) | Mass Flow Rate | Press. Drop (psi) | Minimum Performan (watts) |
|---|---|---|---|---|---|---|---|---|---|---|
| 1. | 0.030 | 0.010 | 0.010 | 0.727 | 0.748 | 0.984 | 0.787 | $H_2O$ 2 gal/min | 2 | 250 |
| 2. | 0.062 | 0.008 | 0.080 | 0.513 | 7.087 | 2.756 | 0.575 | Silicon oil | | 1500 |
| 3. | 0.030 | 0.010 | 0.080 | 0.570 | 5.000 | 2.067 | 0.630 | $H_2$ 1–2.5 lit/min | 2.5 | 500 |
| 4. | 0.120 | 0.020 | 0.040 | 0.810 | 8.268 | 2.000 | 1.000 | 37–50 cfm | | 120 |
| 5. | 0.300 | 0.020 | 0.076 | 2.000 | 2.900 | 3.000 | 2.300 | Air | | 85 |
| 6. | 0.100 | 0.010 | 0.100 | 0.700 | 3.000 | 3.000 | 0.800 | Air | | 100 |
|  | 0.100 | 0.010 | 0.100 | 0.700 | 4.000 | 4.000 | 0.800 | Air | | 200 |
|  | 0.100 | 0.010 | 0.100 | 0.700 | 5.000 | 5.000 | 0.800 | Air | | 300 |
|  | 0.130 | 0.010 | 0.100 | 1.070 | 3.000 | 3.000 | 1.200 | Air | | 100 |
|  | 0.130 | 0.010 | 0.100 | 1.070 | 4.000 | 4.000 | 1.200 | Air | | 200 |
|  | 0.130 | 0.010 | 0.100 | 1.070 | 5.000 | 5.000 | 1.200 | Air | | 300 |
| 7. | 0.100 | 0.020 | 0.080 | 0.931 | 1.752 | 3.008 | 1.031 | Air | | 20 |
| 8. | 0.250 | 0.008 | 0.080 | 0.470 | 17.00 | 5.550 | 0.625 | Turbine oil 1 ½ gal/min | 10 | 1000–4000 |
| 9. | 0.030 | 0.008 | 0.040 | 0.340 | 1.750 | 1.750 | 0.400 | 30–100 lin ft/min. | | 4 |
| 10. | 0.125 | 0.008 | 0.040 | 0.375 | 2.000 | 2.000 | 0.500 | 100–1000 lin ft/min. | | 32–38 |
| 11. | 0.100 | 0.008 | 0.040 | 0.400 | 2.000 | 2.000 | 0.500 | 200 lin ft/min. | | 30 |
| 12. | 0.030 | 0.010 | 0.040 | 0.250 | 1.980 | 1.980 | 0.280 | 300 lin ft/min. | | 10 |
| 13. | 0.079 | 0.008 | 0.115 | 0.157 | 1.378 | 2.990 | 0.236 | Air | | |
| 14. | 0.157 | 0.020 | 0.111 | 0.906 | 1.937 | 1.937 | 1.063 | Air | | |
|  | 0.157 | 0.020 | 0.111 | 0.906 | 0.787 | 0.787 | 1.063 | Air | | |
|  | 0.157 | 0.020 | 0.111 | 0.906 | 1.575 | 1.575 | 1.063 | Air | | |
| 15. | 0.125 | 0.008 | 0.040 | 0.375 | 1.000 | 1.000 | 0.500 | No Fan- | | 15 |
|  | 0.125 | 0.008 | 0.040 | 0.375 | 2.000 | 1.000 | 0.500 | Passive | | 15 |
|  | 0.125 | 0.008 | 0.040 | 0.375 | 3.000 | 1.000 | 0.500 | | | 15 |
| 16. | 0.062 | 0.010 | 0.010 | 0.625 | 4.000 | 4.000 | 0.750 | $H_2O$ | 3 | 3000 |
| 17. | 0.125 | 0.020 | 0.040 | 1.875 | 3.100 | 3.000 | 2.000 | 1000–3000 lin/ft min. | | 120 |
| 18. | 0.062 | 0.020 | 0.040 | 1.875 | 12.00 | 5.500 | 2.000 | 100 lin ft/min. | | 300 |

Generally speaking, at least one channel 42 is profiled at a selected location in each fin to accommodate flow of a selected coolant fluid. Upon stacking the fins, each channel thus forms a fluid receiving chamber 49. As fluid 45 flows through the channel, heat removal is effected. To maximize fluid flow and, hence, the rate of heat dissipation, the ratio of channel width to laminate width is relatively large. Suitable fluids include air, helium or other suitable heat transfer gases, water, oil, ethylene glycol, or a dielectric fluid such as a fluorocarbon or FLOURNERT™ type liquid.

According to a further embodiment of the present invention, as shown in FIG. 15, each fin has a narrowed, fluid-filled channel such that spacers 48 are formed at one end of each fin and about midway between the fin ends. Channels in the fins are optionally filled with a dielectric fluid such as a fluorocarbon or FLOURNERT™ type fluid, then stacked upon one another to form cooling chambers containing both liquid and vapor cooling regions on one side of the heat exchanger structure. The other side of the structure has open air, heat dissipating fins 50. This construction makes use of direct bond copper to produce a hermetic seal between layers for capturing the fluid and, it has been found, provides optimal heat removal for a variety of heat transfer applications.

Still another embodiment of the present invention is set forth in FIG. 14. Spacers 48 are located at one end of each fin. Stacking the fins upon one another results in a heat exchanger structure of open air, heat dissipating fins 51.

The spacers may also be at one end and at the midsection of each fin, as provided in FIG. 12. Laminated copper strips of controlled oxygen content C11000, e.g., C11004, are machined with steps and channels to a selected cross-section. Open air, heat dissipating fins 51 are provided for enhanced heat dissipation, and a chamber with a vapor region and a fluid region. This combination type concept enhances the conduction and transfer of heat away from the SCR or other heat source with maximum possible ΔT across the interface between the bottom of the chill block and the top of the heat source. In general, the larger the ΔT, the greater the chill block efficiency.

Other block configurations using machined strip include a thin fin with narrow channels, as set forth in FIGS. 16A and 16B. Preferred fin thicknesses of these configurations may fall generally within a range of 0.005 in. and 0.030 in. The spacing between fins is also preferably within this range. Desirably, fin height is between about 0.250 in. and about 1.000 in. Optional base bottom plate(s) and/or top plate(s) range generally between 0.020 in. and 0.060 in. in thickness. Spacer width, for example, is about 0.030 in.

Figure 17A:
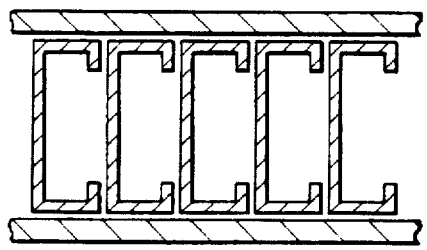
FIGS. 17A and 17B are side views of heat exchanger assemblies with machined fins in accordance with a further aspect of the present invention.
Figure 17B:
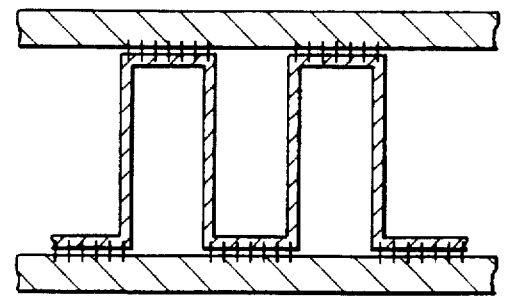

Thin fin designs with wide channels, but using formed strip, are provided in FIGS. 17A and 17B. Fin thicknesses by these designs are desirably within a range of 0.005 in. and 0.030 in., while spacing between the fins is preferably between about 0.040 in. and about 0.125 in. Fin height is, e.g., between about 0.250 in. and about 1.000 in. Base bottom plate(s) and/or top plate(s) are again optional and have a thickness range generally between 0.020 in. and 0.060 in., with spacer width being about 0.030 in.

Figure 18A:
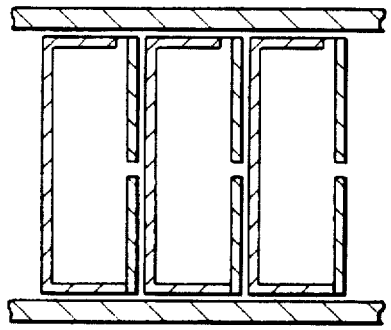
FIGS. 18A and 18B are side views of heat exchanger assemblies with fins machined or formed in accordance with a yet another aspect of the present invention.
Figure 18B:
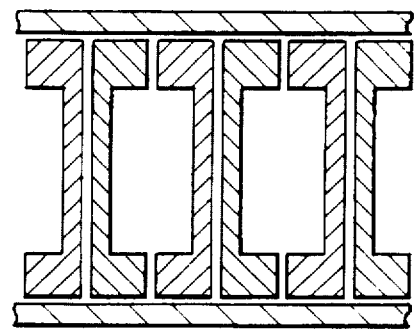

Thick finned, wide channel designs which may use machined strip or formed strip are shown in FIGS. 18A and 18B. Fin thickness, for example, is generally within a range of 0.010 in. and 0.060 in., and fin spacing is between about 0.040 in. and 0.300 in. Fin height is preferably within a range of about 0.250 in. and 3.000 ins., with optional base bottom and/or top plates being generally within a range of 0.060 in. and 0.125 in. thick.

Fin materials include solid controlled oxygen content C11000 containing about 400 ppm $O_2$, a clad laminate of C11000 and C10100, solid Alloy C11004, or another suitable material, e.g., stainless steel. Top and bottom plates may be copper, a copper clad laminate, Alloy C11004 or another suitable material, e.g., stainless steel. For improved electrical isolation and controlled expansion, a ceramic material may be substituted for the plates.

Acceptable techniques for assembly include, but are not limited to, machined strip stacking (i.e., rivet, EB weld, clamp), machined strip stacking on plate, machined strip stacking in tube, flat strip with spacers, formed strip on plate, and formed strip in tube.

The present invention is advantageous in providing joining techniques that are clean and strip processing which allows ready enhancement of surfaces, i.e., hole punching, embossing, coating, texturing, forming, tapering, and other surface treatments. In addition, the integration of direct bond copper technology with new materials and assembly methods provides numerous possible solutions to the challenge of dimensional optimization in heat transfer designs. As a result, fin thicknesses between 0.005 in. and 0.010 in. are now possible, and fin spacings between about 0.005 in. and 0.030 in. are no longer a problem.

Figure 19B:
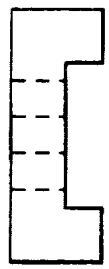
FIG. 19B is a side view of the strip in FIG. 19A.
Figure 19A:
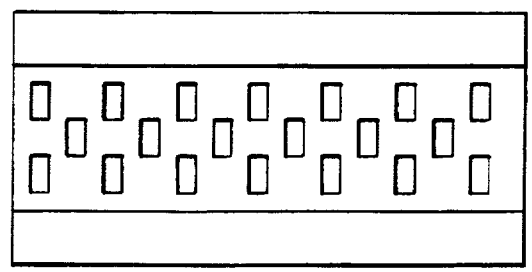
FIG. 19A is a plan view of hole punched strip in accordance with still another aspect of the present invention.
Figure 22:
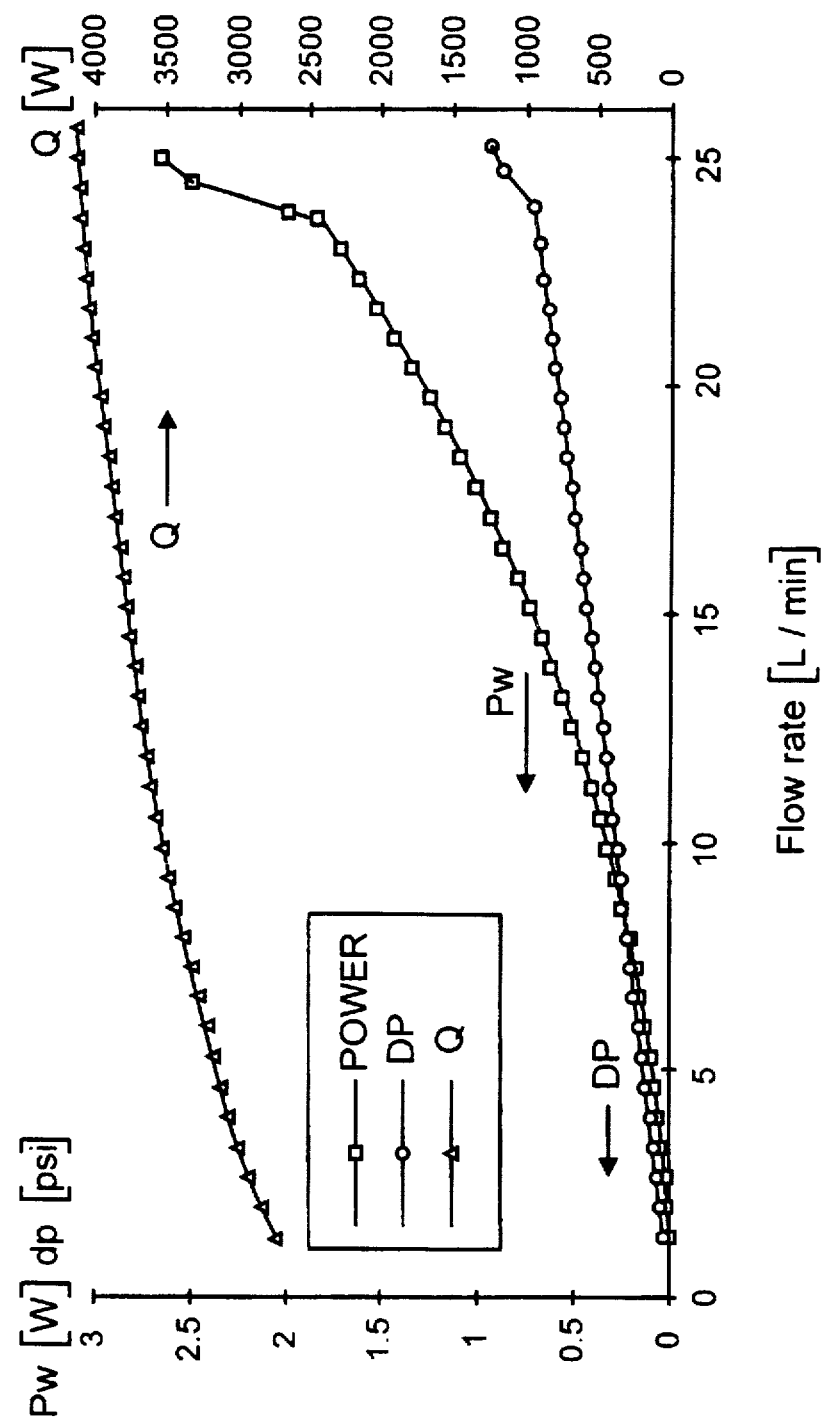
FIG. 22 is a graph of heat transfer rate, pressure drop and pumping power as a function of coolant flow rate, according to one aspect of the present invention.
Figure 23:
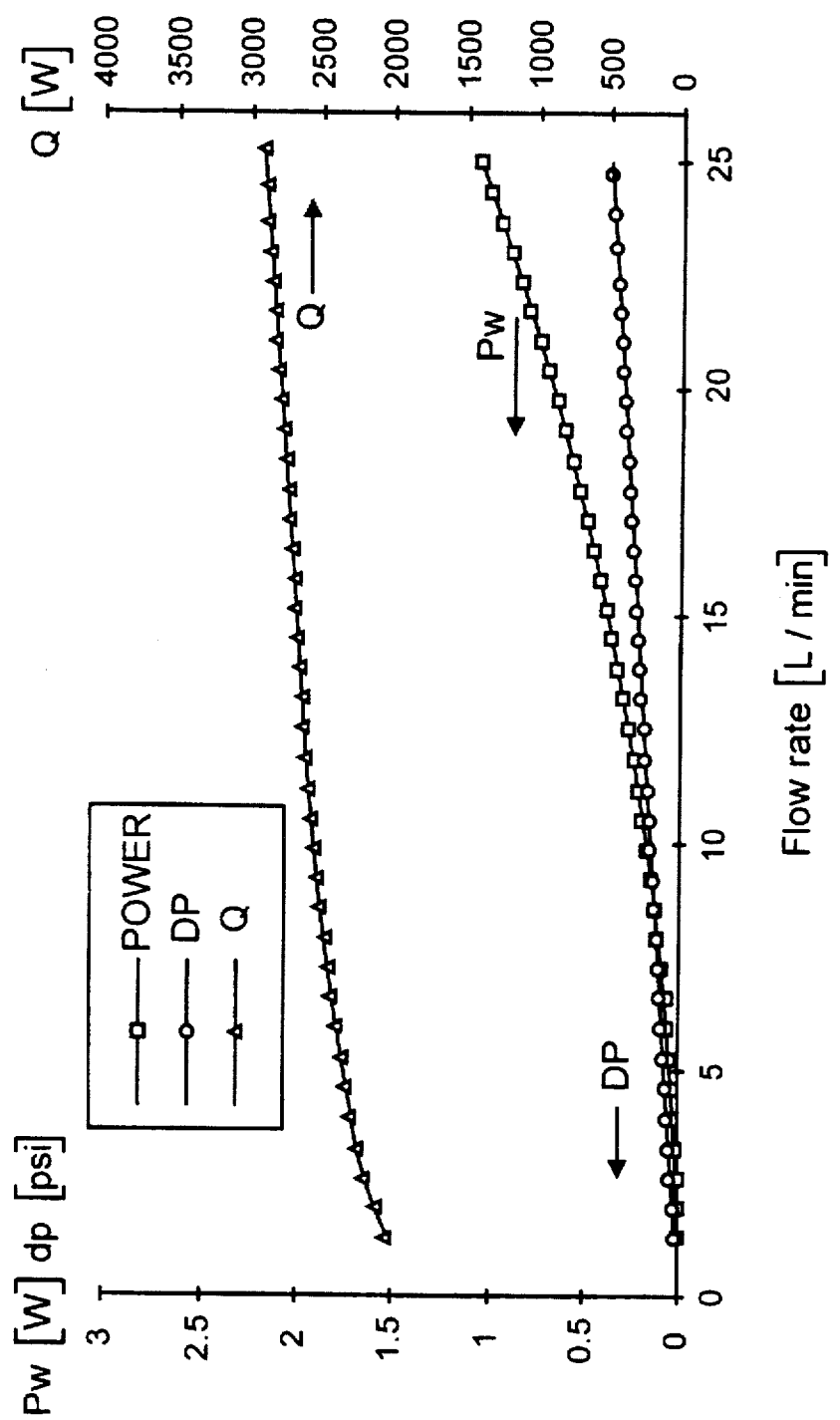
FIG. 23 is a graph of heat transfer rate, pressure drop and pumping power as a function of coolant flow rate, according to another aspect of the present invention.
Figure 24:
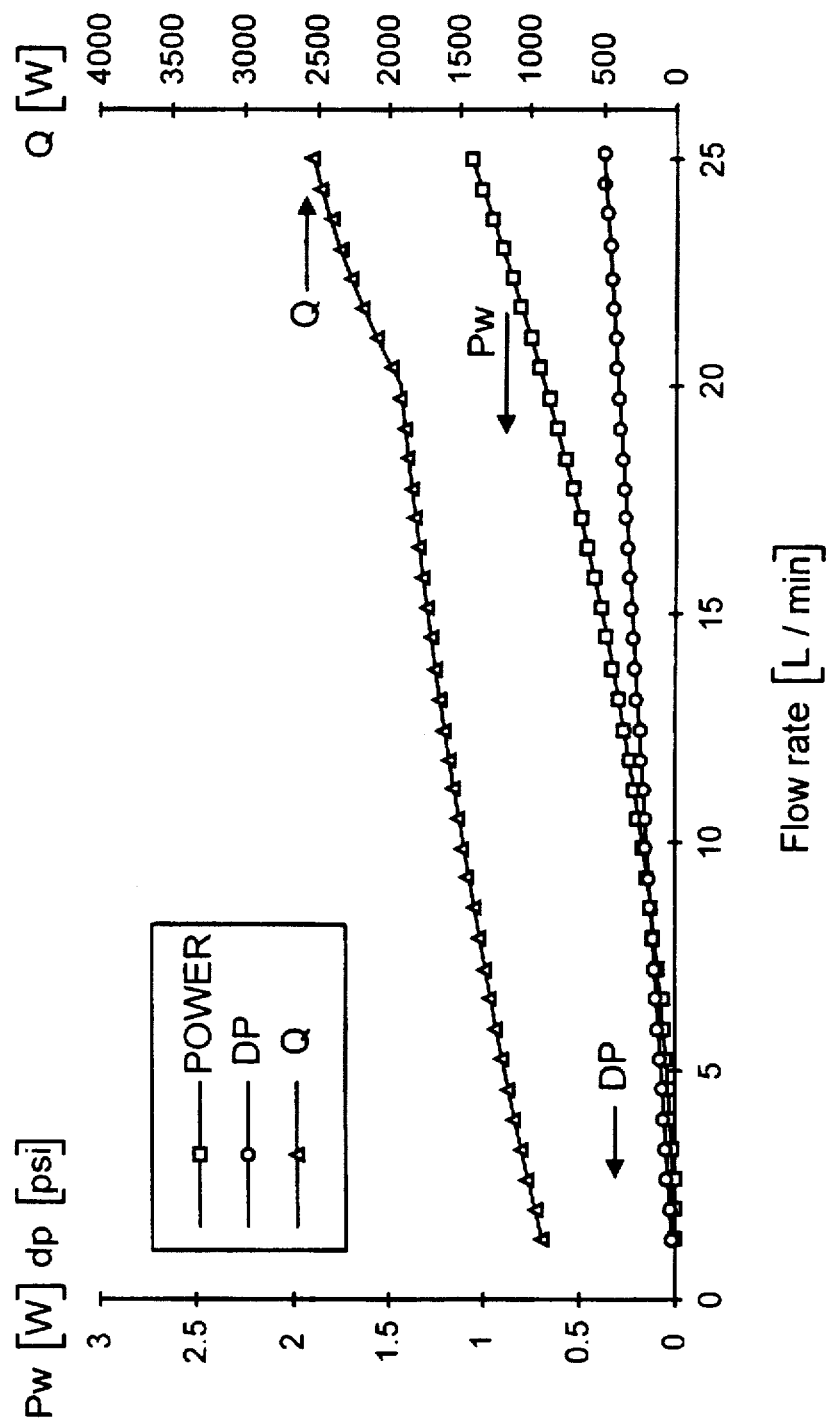
FIG. 24 is a graph of heat transfer rate, pressure drop and pumping power as a function of coolant flow rate, according to a further aspect of the present invention.
Figure 25:
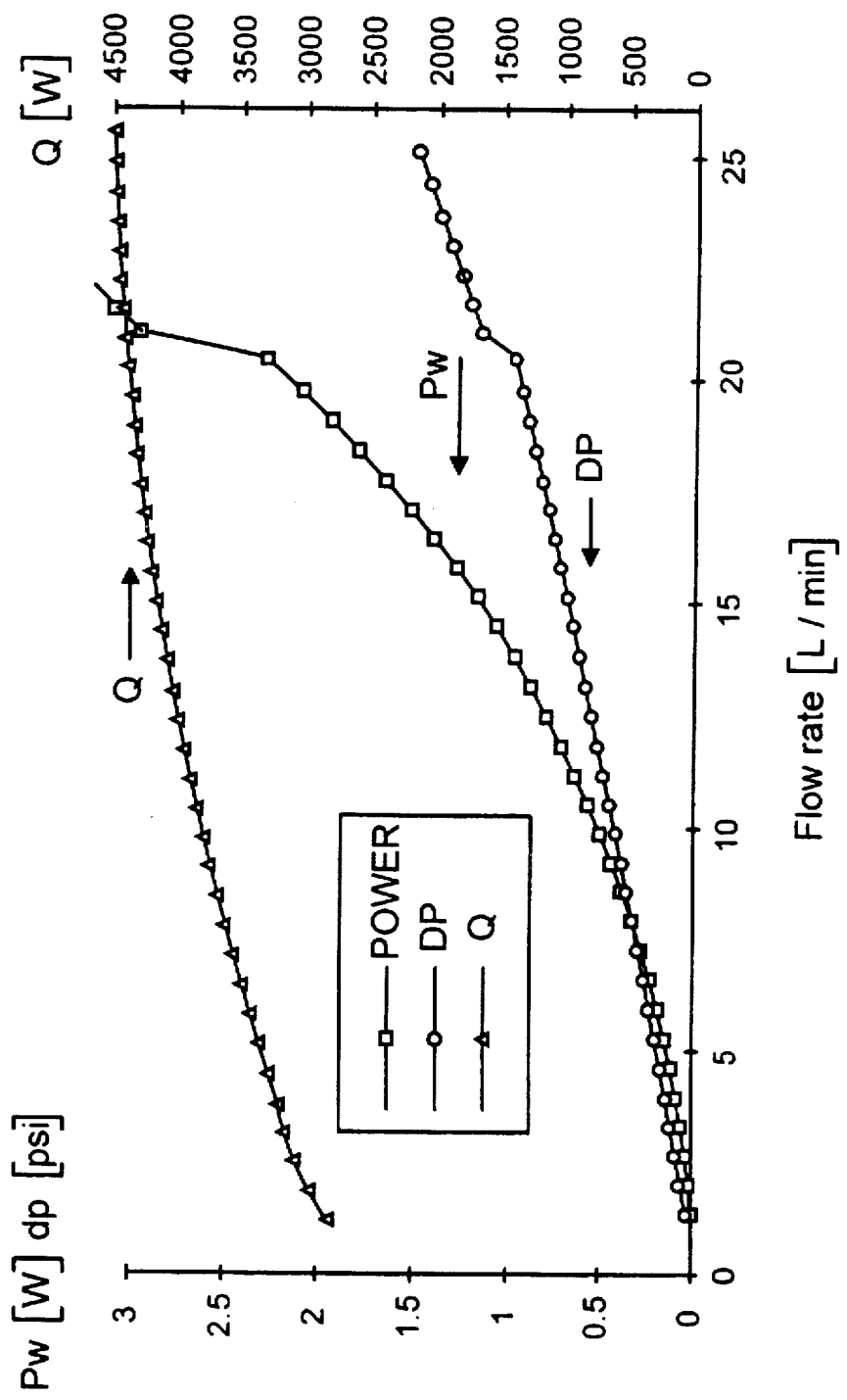
FIG. 25 is a graph of heat transfer rate, pressure drop and pumping power as a function of coolant flow rate, according to still another aspect of the present invention.

Hole punched strip is shown, for example, in FIGS. 19A and 19B. An objective of hole punching is to break-up boundary layer flow conditions created as air or another fluid passes over the fin surface. The disruption of air flow along the strip surface reduces substantially the thickness of boundary layer flow. In reducing thermal resistance, heat transfer from the fin to the fluid is improved. This, in turn, increases performance of the heat exchanger and reduces material content and weight. It is noted that the pattern, size, and location of the holes are application specific.

Other means of breaking up boundary layer conditions without reducing surface area include embossed surfaces, e.g., diamonds, as set forth in FIGS. 20A and 20B, formed surfaces, e.g., louvers, as provided in FIGS. 21A, 21B, and 21C, and tapers, shown in FIGS. 21D and 21E. Formed surfaces have the added benefit of flow direction control and mixing between layers or flow channels.

Figure 26:
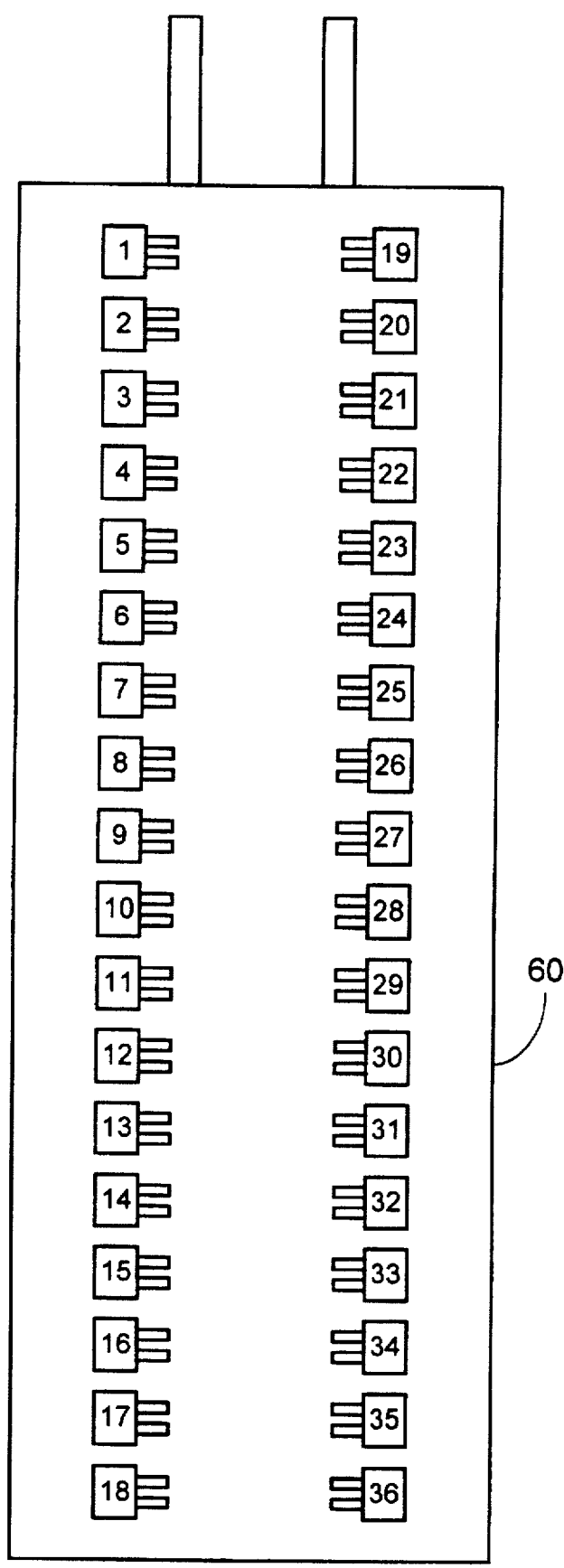
FIG. 26 shows an illustrative motor control module having a series of power transistor switches, according to the present invention.
Figure 27:
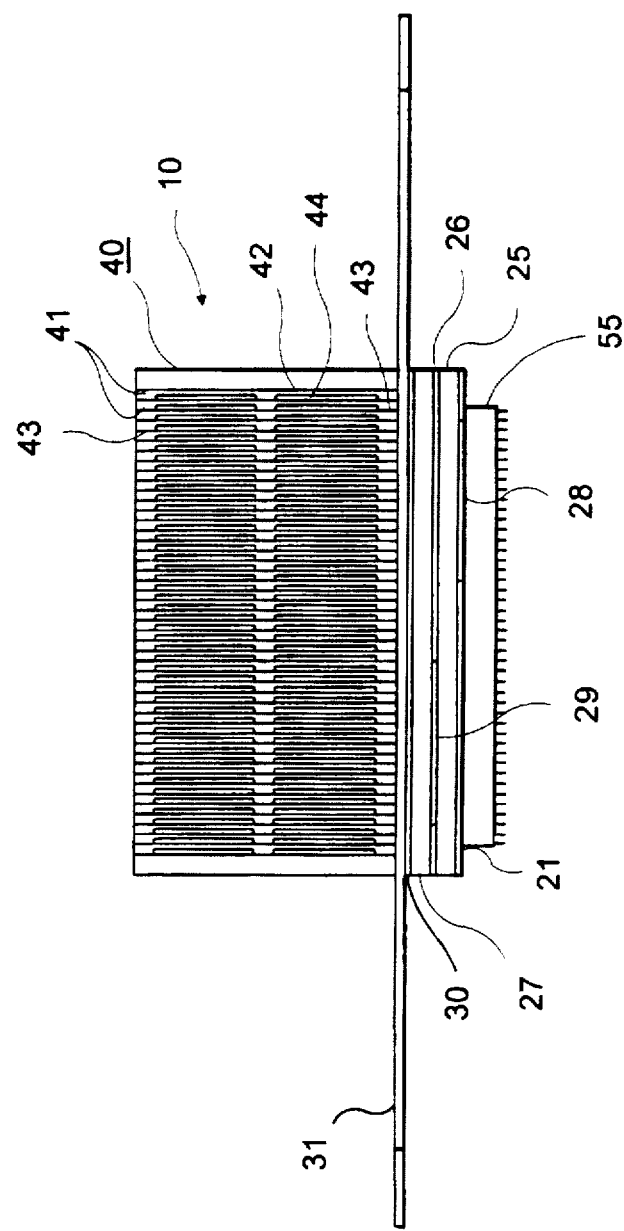
FIG. 27 is a perspective view of a heat exchanger assembly, in accordance with the present invention, mounted to a silicon control rectifier.

Shown in FIG. 27 is a heat exchanger assembly, in accordance with the present invention, mounted atop a silicon control rectifier (SCR) or integrated gate bipolar transistor (IGBT) 55. Alternatively, the SCR may be mounted to a heat exchanger assembly, in accordance with the present invention. These assemblies are then mounted to a motor control module 60, as illustrated in FIG. 26.

Figure 28:
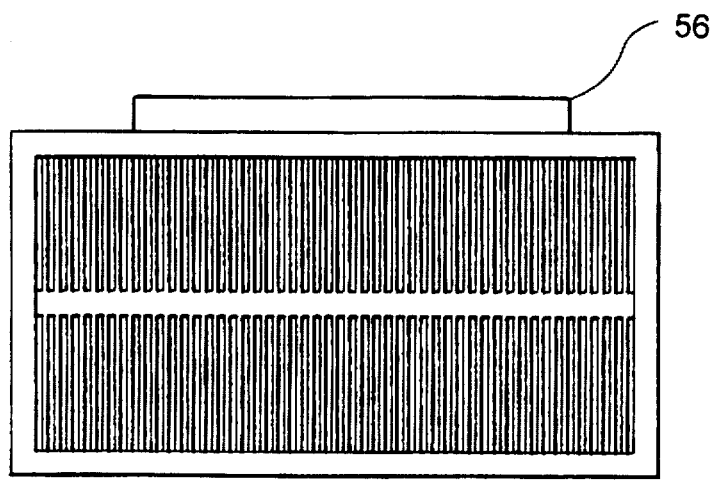
FIG. 28 is a perspective view of a state-of-the-art microprocessor mounted to a heat exchanger assembly in accordance with the present invention.
Figure 29:
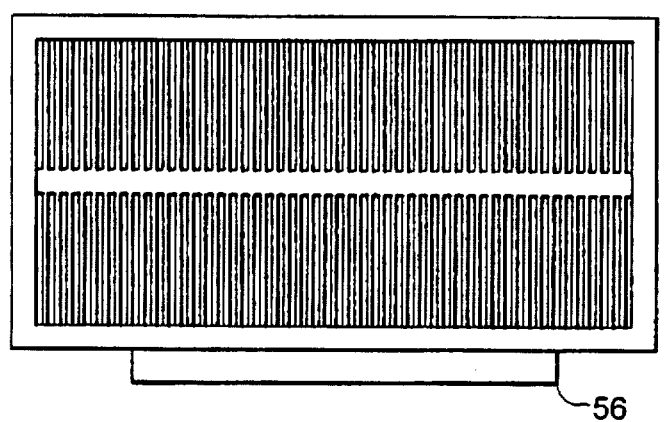
FIG. 29 is a perspective view of a heat exchanger assembly, in accordance with the present invention, mounted to a state-of-the-art microprocessor.

FIG. 28 and 29 illustrate, respectively, a state-of-the-art microprocessor 56 such as the PENTIUM™ 486, P60™, P70™, P80™ or POWERPC™ mounted to a heat exchanger assembly of the present invention (and a heat exchanger assembly mounted atop a state-of-the-art micro-chip).

In accordance with another aspect of the present invention, there is provided a method of making a high performance heat exchanger assembly. Initially, the first oxygen-rich copper base layer is joined to the first layer of beryllium oxide. Next, the intermediate oxygen-rich copper layer is joined to the first beryllium oxide layer, and the second beryllium oxide layer is joined to the intermediate oxygen-rich copper layer.

Then, the second oxygen-rich copper layer is joined to the second beryllium oxide layer, and a second base layer of oxygen-rich copper is joined to the second oxygen-rich copper layer. The heat exchanger structure may then be joined, e.g., direct bonded, to the second oxygen-rich copper base layer.

In accordance with a further aspect of the present invention is a method of making a high performance heat exchanger assembly, which comprises a first step of joining the heat exchanger structure to the first controlled oxygen content copper laminate, having a base layer of oxygen-rich copper and a first layer of oxygen-free copper, at the oxygen-free copper first layer.

Next, the first beryllium oxide layer is joined to the oxygen-rich copper base layer of the first copper laminate and the intermediate oxygen-rich copper layer is joined to the first beryllium oxide layer. The second beryllium oxide layer is then joined to the intermediate oxygen-rich copper layer.

Finally, the second controlled oxygen content copper laminate, having a base layer of oxygen-free copper and a first layer of oxygen-rich copper, to the second layer of beryllium oxide at the oxygen-rich copper first layer.

It will be understood by those skilled in the art that steps of assembly may be varied, giving consideration to feasibility and manufacturing preference.

Illustrated in FIGS. 22–25 are graphs of heat transfer rate, pressure drop and pumping power as a function of coolant flow rate, according to various aspects of the present invention. In each case illustrated, the coolant is a 60/40 water-glycol mixture. The coolant inlet temperature was about 70° C. and the base temperature of the heat sink is about 100° C. The height of the fins was about 0.433 in., the total width was about 1.870 ins., and the depth about 5.000 ins. It is noted that a particular advantage is of Alloy C11004 is that it permits direct bonding of high oxygen content, i.e., high performance copper, to other high oxygen, high performance copper, and to ceramics such as beryllium oxide. In this manner, full advantage may be taken of the extraordinary thermal conductivity of pure copper.

While the present invention has been shown and described in connection with oxygen-free and oxygen-rich copper, other materials may be used, alternatively or concurrently therewith, such as those containing precious metals, aluminum, titanium, nickel, steel, and their alloys as well as carbon and ceramics. It is also foreseeable that an intermediate bonding layer such as nickel, titanium or silver could be added between the copper layers to modify properties of the laminate materials.

Overall, the present invention facilitates cost effective mass production of high performance chill blocks, and significantly expands their cooling and isolation characteristics to advanced microelectronic applications. Moreover, this assembly maximizes the energy transfer capability of chill blocks while maintaining acceptable acoustics and pressure drop for sensitive microelectronics nearby, and at a low cost.

The present invention is also beneficial in permitting the use of pure copper which has a substantially higher thermal conductivity than that of Cu thick film, Mo—Mn thick film or As—Pd thick film and a substantially lower resistivity. The use of DBCu, it is noted, provides electrical conductivity within about 5% of that of pure copper.

Be is beneficial in having a thermal conductivity substantially higher than that of AlN. The use of copper fins with a base of Cu—Be laminates together provides superior thermal resistance performance over AlN—Cu or Al2O3—Cu. A substantially higher maximum conductor current is also provided without the need for an intermediate bonding layer.

Various modifications and alterations to the present invention may be appreciated based on a review of this disclosure. These changes and additions are intended to be within the scope and spirit of this invention as defined by the following claims.

What is claimed is:

1. A heat exchanger assembly, which comprises:
   a first base layer of oxygen-rich copper joined to a first layer of beryllium oxide;
   a first oxygen-rich copper layer joined to the first beryllium oxide layer;
   a second beryllium oxide layer joined to the first oxygen-rich copper layer;
   a second oxygen-rich copper layer joined to the second beryllium oxide layer;
   a second base layer of oxygen-rich copper joined to the second oxygen-rich copper layer; and
   a heat exchanger structure joined to the second base layer, the structure comprising a plurality of oxygen-rich copper fins stacked upon one another, each of the fins having a channel at a selected location therein, and material to material interfaces between adjacent stacked fins being joined to one another so as to form a solidified block structure, each channel forming a cooling chamber.

2. The assembly set forth in claim 1 wherein the oxygen-rich copper is C11000.

3. The assembly set forth in claim 1 wherein the oxygen-rich copper is C11004.

4. The assembly set forth in claim 1 wherein the oxygen-free copper is C10100.

5. A high performance heat exchanger assembly, which comprises:
   a first base layer of oxygen-rich copper direct bonded to a first layer of beryllium oxide;
   a first oxygen-rich copper layer direct bonded to the first beryllium oxide layer;
   a second beryllium oxide layer bonded to the first oxygen-rich copper layer;
   a second oxygen-rich copper layer direct bonded to the second beryllium oxide layer;
   a second base layer of oxygen-rich copper joined to the second oxygen-rich copper layer; and
   a heat exchanger structure direct bonded to the second base layer, the structure comprising a plurality of oxygen-rich copper fins stacked upon one another, each of the fins having a channel at a selected location therein, and material to material interfaces between adjacent stacked fins being direct bonded to one another so as to form a solidified block structure, each channel forming a cooling chamber.

6. A method of making a heat exchanger assembly, which comprises the steps of:
   joining a first base layer of oxygen-rich copper to a first layer of beryllium oxide;
   joining a first oxygen-rich copper layer to the first beryllium oxide layer;
   joining a second beryllium oxide layer to the first oxygen-rich copper layer;
   joining a second oxygen-rich copper layer to the second beryllium oxide layer;
   joining a second base layer of oxygen-rich copper to the second oxygen-rich copper layer; and
   joining a heat exchanger structure to the second base layer, the structure comprising a plurality of oxygen-rich copper fins stacked upon one another, each of the fins having a channel at a selected location therein, and material to material interfaces between adjacent stacked fins being joined to one another so as to form a solidified block structure, each channel forming a cooling chamber.

7. A method of making a heat exchanger assembly, which comprises the steps of:
   joining a heat exchanger structure to a first oxygen-rich copper base layer, the structure comprising a plurality of oxygen-rich copper fins stacked upon one another, each of the fins having a channel at a selected location therein, and material to material interfaces between adjacent stacked fins being joined to one another so as to form a solidified block structure, each channel forming a cooling chamber;
   joining a first beryllium oxide layer to the first base layer;
   joining, a first oxygen-rich copper layer to the first beryllium oxide layer;
   joining a second beryllium oxide layer to the intermediate oxygen-rich copper layer; and
   joining a second oxygen-rich copper base layer to the second layer of beryllium oxide.

8. A heat exchanger assembly, which comprises:
   a first base layer of oxygen-rich copper joined to a first layer of beryllium oxide;
   a first oxygen-rich copper layer joined to the first beryllium oxide layer;
   a second beryllium oxide layer joined to the first oxygen-rich copper layer;
   a second oxygen-rich copper layer joined to the second beryllium oxide layer;
   a second base layer of oxygen-rich copper joined to the second oxygen-rich copper layer; and
   a heat exchanger structure joined to the second base layer, the structure comprising a plurality of oxygen-rich copper fins stacked upon one another, each of the fins having a channel at a selected location therein, and material to material interfaces between adjacent stacked fins being joined to one another so as to form a solidified block structure, each channel forming a cooling chamber and being at least partially filled with a selected coolant fluid.

9. The assembly set forth in claim 8 wherein the fluid is air.

10. The assembly set forth in claim 8 wherein the fluid is a dielectric fluid.

11. The assembly set forth in claim 8 wherein the cooling chambers have a liquid region and a vapor region.

12. A heat exchanger assembly, which comprises:
   a first base layer of Alloy C11004 joined to a first layer of beryllium oxide;
   a first layer of Alloy C11004 joined to the first beryllium oxide layer;
   a second beryllium oxide layer joined to the first layer of Alloy C11004;
   a second layer of Alloy C11004 joined to the second beryllium oxide layer;
   a second base layer of Alloy C11004 joined to the second layer of Alloy C11004; and
   a heat exchanger structure joined to the second base layer, the structure comprising a plurality of fins of Alloy C11004 stacked upon one another, each of the fins having a channel at a selected location therein, and material to material interfaces between adjacent stacked fins being joined to one another so as to form a solidified block structure, each channel forming a cooling chamber.

13. A high performance heat exchanger assembly which comprises:
   a first base layer of Alloy C11004 direct bonded to a first layer of beryllium oxide;
   a first layer of Alloy C11004 direct bonded to a first beryllium oxide layer;
   a second beryllium oxide layer direct bonded to the first layer of Alloy C11004;
   a second layer of Alloy C11004 direct bonded to the second beryllium oxide layer;
   a second base layer of Alloy C11004 joined to the second layer of Alloy C11004; and
   a heat exchanger structure direct bonded to the second base layer, the structure comprising a plurality of fins of alloy C11004 stacked upon one another, each of the fins having a channel at a selected location therein, and material to material interfaces between adjacent stacked fins being direct bonded to one another so as to form a solidified block structure, each channel forming a cooling chamber.

14. A heat exchanger structure joined to an oxygen-rich copper layer, the structure comprising a plurality of oxygen-rich copper fins stacked upon one another, each of the fins having a channel at a selected location therein, and material to material interfaces between adjacent stacked fins being joined to one another so as to form a solidified block structure, each channel forming a cooling chamber.

15. A heat exchanger structure joined to a layer of Alloy C11004, the structure comprising a plurality of fins of Alloy C11004 stacked upon one another, each of the fins having a channel at a selected location therein, and material to material interfaces between adjacent stacked fins being joined to one another so as to form a solidified block structure, each channel forming a cooling chamber.

16. A heat exchanger structure joined to an oxygen-rich copper first layer, the structure comprising a plurality of oxygen-rich copper fins stacked upon one another, each of the fins having a channel at a selected location therein, and material to material interfaces between adjacent stacked fins being joined to one another so as to form a solidified block structure, each channel forming a cooling chamber, and being at least partially filled with a selected coolant fluid.

17. The structure set forth in claim 16 wherein the fluid is air.

18. The structure set forth in claim 16 wherein the fluid is a dielectric fluid.

19. The structure set forth in claim 16 wherein the cooling chambers have a liquid region and a vapor region.

20. A heat exchanger base having:
   a first base layer of oxygen-rich copper joined to a first layer of beryllium oxide;
   a first oxygen-rich copper layer joined to the first beryllium oxide layer;
   a second beryllium oxide layer joined to the first oxygen-rich copper layer;
   a second base layer of oxygen-rich copper joined to the second oxygen-rich copper layer; and
   a second oxygen-rich copper base layer joined to the second beryllium oxide layer.

21. The heat exchanger base of claim 20 wherein the first base layer has a member for connection to a heat source.

22. The heat exchanger base of claim 20 wherein the intermediate oxygen-rich copper layer has a member for connection to a heat source.

23. The heat exchanger base of claim 20 wherein the first base layer is a controlled oxygen content copper clad laminate.

24. The heat exchanger base of claim 20 wherein the second base layer is a controlled oxygen content copper clad laminate.

25. The heat exchanger base of claim 20 wherein the oxygen-rich copper layers are joined to one another by cladding.

26. The heat exchanger base of claim 23 or claim 24 wherein at least one of the oxygen-rich copper layers is joined to at least one oxygen-free copper layer by cladding.

27. The heat exchanger base of claim 20 wherein at least one of the oxygen-rich copper layers is joined to at least one oxygen-free copper layer by direct bonding.

28. The heat exchanger base of claim 20 wherein at least one of the oxygen-rich copper layers is joined to at least one beryllium oxide layer by direct bonding.

29. The heat exchanger base of claim 20 wherein at least one of the oxygen-rich copper layers is Alloy C11004.

30. A vehicle propelled by an electric motor, the motor comprising a motor control module having a series of power transistor switches, each effecting an increment of vehicle acceleration upon activation, and corresponding heat exchanger assemblies for dissipating heat energy generated upon activation of the switches, each of the assemblies comprising:
   a first base layer of oxygen-rich copper joined to a first layer of beryllium oxide;
   a first oxygen-rich copper layer joined to the first beryllium oxide layer;
   a second beryllium oxide layer joined to the first oxygen-rich copper layer;
   a second base layer of oxygen-rich copper joined to the second oxygen-rich copper layer; and
   a heat exchanger structure joined to the second base layer, the structure comprising a plurality of oxygen-rich copper fins stacked upon one another, each of the fins having a channel at a selected location therein, and material to material interfaces between adjacent stacked fins being joined to one another so as to form a solidified block structure, each channel forming a cooling chamber.

31. The vehicle set forth in claim 30 wherein at least one of the layers of oxygen-rich copper is Alloy C11004.

32. A vehicle propelled by an electric motor, the motor comprising a motor control module having a series of power transistor switches, each effecting an increment of vehicle acceleration upon activation, and corresponding heat exchanger assemblies for dissipating heat energy generated upon activation of the switches, each of the assemblies comprising:
   a first base layer of oxygen-rich copper joined to a first layer of beryllium oxide;
   a first oxygen-rich copper layer joined to the first beryllium oxide layer;
   a second beryllium oxide layer joined to the first oxygen-rich copper layer;
   a second layer of oxygen-rich copper joined to the second beryllium oxide layer;
   a second base layer of oxygen-rich copper joined to the second oxygen-rich copper layer; and a heat exchanger structure joined to the second base layer, the structure comprising a plurality of oxygen-rich copper fins stacked upon one another, each of the fins having a channel at a selected location therein, and material to material interfaces between adjacent stacked fins being joined to one another so as to form a solidified block structure, each channel forming a cooling chamber and being at least partially filled with a selected coolant fluid.

33. An ultra high performance microprocessor in combination with a heat exchanger assembly adapted for dissipating heat energy generated by the microprocessor, the assembly comprising:

a first base layer of oxygen-rich copper joined to a first layer of beryllium oxide;

a first oxygen-rich copper layer joined to the first beryllium oxide layer;

a second beryllium oxide layer joined to the first oxygen-rich copper layer;

a second layer of oxygen-rich copper joined to the second beryllium oxide layer;

a second base layer of oxygen-rich copper joined to the second oxygen-rich copper layer; and a heat exchanger structure joined to the second base layer, the structure comprising a plurality of oxygen-rich copper fins stacked upon one another, each of the fins having a channel at a selected location therein, and material to material interfaces between adjacent stacked fins being joined to one another so as to form a solidified block structure, each channel forming a cooling chamber and being at least partially filled with a selected coolant fluid.

* * * * *